United States Patent
Kim et al.

(12)

(10) Patent No.: US 12,284,795 B2
(45) Date of Patent: Apr. 22, 2025

(54) WEARABLE ELECTRONIC DEVICE INCLUDING HEAT DISSIPATION STRUCTURE

(71) Applicant: Samsung Electronics Co., Ltd., Suwon-si (KR)

(72) Inventors: Musul Kim, Suwon-si (KR); Sangchul Jung, Suwon-si (KR); Kwangtai Kim, Suwon-si (KR); Seungnyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/904,209

(22) Filed: Oct. 2, 2024

(65) Prior Publication Data

US 2025/0048606 A1 Feb. 6, 2025

Related U.S. Application Data

(63) Continuation of application No. 18/414,831, filed on Jan. 17, 2024, which is a continuation of application No. PCT/KR2023/021100, filed on Dec. 20, 2023.

(51) Int. Cl.
   *H05K 7/20* (2006.01)
   *G06F 1/16* (2006.01)
   *H05K 5/00* (2006.01)

(52) U.S. Cl.
   CPC ......... *H05K 7/20972* (2013.01); *G06F 1/163* (2013.01); *H05K 5/0086* (2013.01)

(58) Field of Classification Search
   CPC ... H05K 7/20972; H05K 5/0086; G06F 1/163
   See application file for complete search history.

(56) References Cited

U.S. PATENT DOCUMENTS

| | | |
|---|---|---|
| 10,037,062 B1 | 7/2018 | Bhopte |
| 10,261,555 B1 | 4/2019 | Cooper |

(Continued)

FOREIGN PATENT DOCUMENTS

| | | |
|---|---|---|
| CN | 209015063 | 6/2019 |
| CN | 218446233 | 2/2023 |

(Continued)

OTHER PUBLICATIONS

U.S. Appl. No. 18/414,831, filed Jan. 17, 2024.

(Continued)

*Primary Examiner* — Mukundbhai G Patel
(74) *Attorney, Agent, or Firm* — Nixon & Vanderhye P.C.

(57) ABSTRACT

A wearable electronic device according to an embodiment may include: a housing disposed and configured to face a user's face, a first display including a display disposed inside the housing and configured to provide visual information to corresponding one of the user's eyes, a first heat dissipation fan disposed to at least partially face the first display and configured to discharge air inside the housing to an outside of the housing, a first heat conductive member comprising a thermally conductive material configured to absorb, dissipate, and/or move heat from the first display, a first heat dissipation fin provided at one end portion of the first heat conductive member and disposed on a movement path of the air discharged by the first heat dissipation fan, a second heat dissipation fan disposed to at least partially face the first display and configured to discharge the air inside the housing to the outside of the housing, a second heat conductive member comprising a thermally conductive material configured to absorb, dissipate, and/or move heat from the second display, and a second heat dissipation fin provided at one end portion of the second heat conductive member and (Continued)

disposed on a movement path of the air discharged by the second heat dissipation fan.

14 Claims, 14 Drawing Sheets

(56) References Cited

U.S. PATENT DOCUMENTS

| | | | |
|---|---|---|---|
| 2017/0184863 A1* | 6/2017 | Balachandreswaran | ..................... G02B 27/0176 |
| 2019/0075689 A1 | 3/2019 | Selvakumar | |
| 2020/0393881 A1* | 12/2020 | Maric | ................ G02B 27/0176 |
| 2021/0185855 A1* | 6/2021 | Maric | ..................... G06F 3/011 |
| 2022/0146838 A1 | 5/2022 | Homma et al. | |
| 2022/0163809 A1* | 5/2022 | Lee | ..................... G02B 27/0176 |
| 2023/0124239 A1 | 4/2023 | Kitamura | |

FOREIGN PATENT DOCUMENTS

| | | |
|---|---|---|
| JP | 4709939 | 3/2011 |
| JP | 2011061229 | 3/2011 |
| JP | 2012069551 | 4/2012 |
| JP | 5127902 | 11/2012 |
| JP | 7217792 | 1/2023 |
| KR | 20050051966 | 6/2005 |
| KR | 100727664 | 6/2007 |
| KR | 10-2022-0070977 A | 5/2022 |

OTHER PUBLICATIONS

PCT International Search Report dated Apr. 11, 2024 for PCT/KR2023/021100.
PCT Written Opinion dated Apr. 11, 2024 for PCT/KR2023/021100.

* cited by examiner

WEARABLE ELECTRONIC DEVICE INCLUDING HEAT DISSIPATION STRUCTURE

CROSS-REFERENCE TO RELATED APPLICATIONS

This application is a continuation application of application Ser. No. 18/414,831, filed on Jan. 17, 2024, which claims priority to International application No. PCT/KR2023/021100, filed on Dec. 20, 2023, which designated the US and claims priority to KR 10-2023-0087804, filed on Jul. 6, 2023 and KR 10-2023-0059589, May 9, 2023, the entire disclosures of each of which are all hereby incorporated by reference herein in their entireties.

BACKGROUND

Field

The disclosure relates to an electronic device such as a wearable electronic device that is wearable on a user's body.

Description of Related Art

A portable electronic device, such as an electronic notebook, a portable multimedia player, a mobile communication terminal, or a tablet personal computer (PC), is generally equipped with a display member (e.g., a display) and a battery, and has a bar-type, a folder-type, or a sliding-type appearance due to the shape of the display member or battery. In recent years, with performance improvement and miniaturization of display members and batteries have been improved in performance, wearable electronic devices, which are wearable on a portion of the body, such as the wrist or the head, have become commercialized. Since the wearable electronic devices are directly worn on the body, the wearable electronic devices can be improved in portability and/or user accessibility.

Among the wearable electronic devices, an electronic device that is wearable on a user's face such as a head-mounted device (HMD) is disclosed. The head mounted device may be usefully used in implementing virtual reality or augmented reality. For example, a wearable electronic device may implement virtual reality by providing a three-dimensional image of a virtual space in a game, which has been enjoyed through a television or a computer monitor, and blocking the image of the real space in which the user is present. Other types of wearable electronic devices may implement augmented reality that provides various visual information to a user by implementing virtual images while providing an environment in which an actual image of a space in which the user is present is visually recognizable.

The above-mentioned information may be provided as a related art for the purpose of helping understanding of the disclosure. No claim or determination is made as to whether any of the foregoing may be applied as prior art in connection with the disclosure.

SUMMARY

A wearable electronic device according to an example embodiment may include: a housing disposed and configured to face a user's face, a first display disposed inside the housing and configured to provide visual information to one of the user's eyes, a first heat dissipation fan disposed to at least partially face the first display and configured to discharge air inside the housing to an outside of the housing, a first heat conductive member comprising a thermally conductive material configured to absorb, dissipate, and/or move heat from the first display, a first heat dissipation fin provided at one end portion of the first heat conductive member and disposed on a movement path of the air discharged by the first heat dissipation fan, a second display configured to provide visual information to another of the user's eyes, a second heat dissipation fan disposed to at least partially face the first display and configured to discharge the air inside the housing to the outside of the housing, a second heat conductive member comprising a thermally conductive material configured to absorb, dissipate, and/or move heat from the second display, and a second heat dissipation fin provided at one end portion of the second heat conductive member and disposed on a movement path of the air discharged by the second heat dissipation fan.

According to an example embodiment of the disclosure, a wearable electronic device may include: a housing disposed and configured to face a user's face, a first display disposed inside the housing and configured to provide visual information to one of the user's eyes, a first heat dissipation fan disposed to at least partially face the first display and configured to discharge air inside the housing to an outside of the housing, a first heat conductive member comprising a thermally conductive material configured to absorb, dissipate, and/or move heat from the first display, a first heat dissipation fin provided at one end portion of the first heat conductive member and at least partially disposed on a movement path of the air discharged by the first heat dissipation fan, a second display configured to provide visual information to another of the user's eyes, a second heat dissipation fan disposed to at least partially face the first display and configured to discharge the air inside the housing to the outside of the housing, a second heat conductive member comprising a thermally conductive material configured to absorb, dissipate, and/or move heat from the second display, a second heat dissipation fin provided at one end portion of the second heat conductive member and at least partially disposed on a movement path of the air discharged by the second heat dissipation fan, an integrated circuit chip disposed in the area or space between the first display and the second display, a third heat conductive member comprising a thermally conductive material configured to absorb, dissipate, and/or move heat from the integrated circuit chip, a third heat dissipation fin provided at one of both end portions of the third heat conductive member and at least partially disposed on the movement path of the air discharged by the first heat dissipation fan, and a fourth heat dissipation fin provided at another of the both end portions of the third heat conductive member and at least partially disposed on the movement path of the air discharged by the second heat dissipation fan. In an example embodiment, the first display and the second display may be configured to move toward or away from each other.

According to an example embodiment of the disclosure, a wearable electronic device may include: a housing disposed and configured to face a user's face, a first display disposed inside the housing and configured to provide visual information to one of the user's eyes, a first heat dissipation fan disposed to at least partially face the first display and configured to discharge air inside the housing to an outside of the housing, a first heat conductive member comprising a thermally conductive material configured to absorb, dissipate, and/or move heat from the first display, at least one first heat dissipation fin provided at an edge of the first heat conductive member, a second display configured to provide visual information to another of the user's eyes, a second heat dissipation fan disposed to at least partially face the first display and configured to discharge the air inside the housing to the outside of the housing, a second heat conductive member comprising a thermally conductive material configured to absorb, dissipate, and/or move heat from the second display, at least one second heat dissipation fin provided at an edge of the second heat conductive member, an integrated circuit chip disposed in the area or space between the first display and the second display, a third heat conductive member comprising a thermally conductive material configured to absorb, dissipate, and/or move heat from the integrated circuit chip, a third heat dissipation fin provided at one of both end portions of the third heat conductive member and at least partially disposed on the movement path of the air discharged by the first heat dissipation fan, and a fourth heat dissipation fin provided at another of the both end portions of the third heat conductive member and at least partially disposed on the movement path of the air discharged by the second heat dissipation fan. In an example embodiment, the first heat dissipation fin is disposed in the space between the first heat conductive member and the first heat dissipation fan, and the second heat dissipation fin is disposed in the space between the second heat conductive member and the second heat dissipation fan.

BRIEF DESCRIPTION OF THE DRAWINGS

The above and/or other aspects, features, and/or advantages of certain embodiments of the present disclosure will be more apparent from the following detailed description, taken in conjunction with the accompanying drawings, in which.

Throughout the appended drawings, like reference numerals may be assigned to like parts, components, and/or structures.

DETAILED DESCRIPTION

Figure 1:
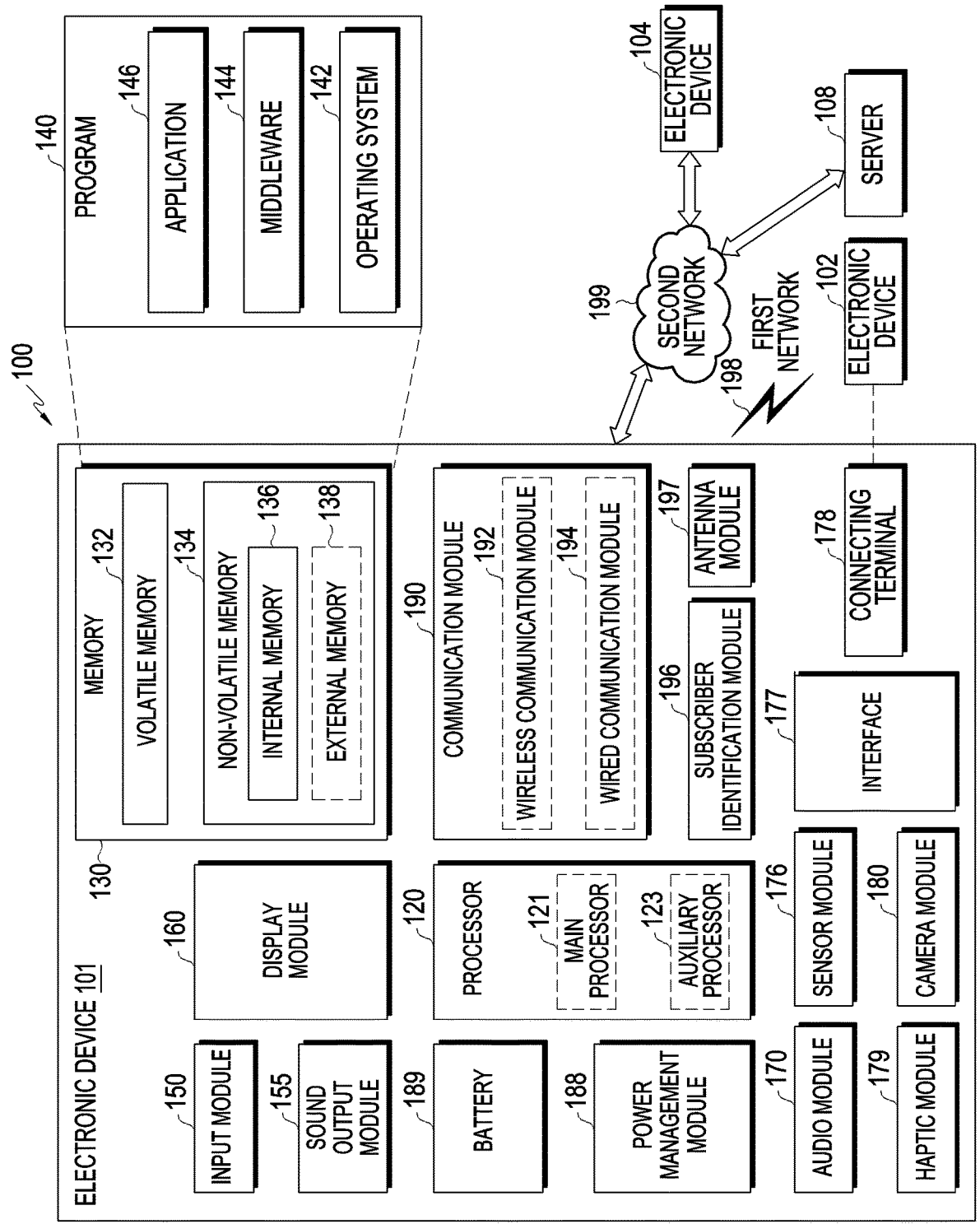
FIG. 1 is a block diagram illustrating an example electronic device in a network environment according to various embodiments.

Electronic devices may generate heat during signal processing or data processing following communication or application execution. The phenomenon of heat generation in electronic devices may increase as the electronic devices become more sophisticated in performance. Heat generated inside electronic devices may impair the operating environment of various electronic components (e.g., integrated circuit chips equipped with circuits such as processors or communication modules). Wearable electronic devices, which are generally used in contact with a user's body, may cause discomfort or low-temperature burns to the user due to heat generation. Therefore, in designing or manufacturing wearable electronic devices as well as general electronic devices, efforts are continuing to implement a structure that quickly dissipates generated heat over a wider area or discharges the generated heat to the outer space. However, compared to the level of advancement in the performance of heat-generating components such as processors and displays, the improvement in heat dissipation performance in electronic devices is insufficient.

An embodiment of the disclosure addresses at least the above-described problems and/or disadvantages and to at least provide advantages described below, and may provide a wearable electronic device including a heat dissipation structure that is capable of quickly dissipating generated heat.

An embodiment of the disclosure may provide a wearable electronic device that provides a stable fit while having stable heat dissipation performance.

The technical problems to be addressed by the disclosure are not limited to those described above, and other technical problems, which are not described above, may be clearly understood from the following description by a person of ordinary skill in the related art, to which the disclosure belongs.

The following description made with reference to the appended drawings may provide an understanding of various example implementations of the disclosure, including the claims and their equivalents. An example embodiment disclosed in the following description includes various specific details to help understanding, but is considered to be one of various example embodiments. Accordingly, it will be understood by one skilled in the art that various implementations described herein may be variously changed and modified without departing from the scope and spirit of the disclosure. In addition, descriptions of well-known functions and configurations may be omitted for clarity and brevity.

The terms and words used in the following description and claims are not limited to a bibliographical meaning, but may be used to describe an embodiment of the disclosure clearly and consistently. Therefore, it will be apparent to those skilled in the art that the following description of various implementations of the disclosure is provided for the purpose of explanation, not for the purpose of limiting the disclosure defined as the scope of rights and equivalents thereto.

It is to be understood that the singular forms of "a", "an", and "the" contain the meaning of "plural" as well, unless the context clearly indicates otherwise. Thus, for example, "a component surface" may be understood to include one or more of the surfaces of the component.

FIG. 1 is a block diagram illustrating an example electronic device 101 in a network environment 100 according to embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mm Wave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with an embodiment of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

An embodiment as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities, and some of the multiple entities may be separately disposed in different components. According to an embodiment, one or more of the above-described components may be omitted, or one or more other components may be added. Alternatively or additionally, a plurality of components (e.g., modules or programs) may be integrated into a single component. In such a case, according to an embodiment, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
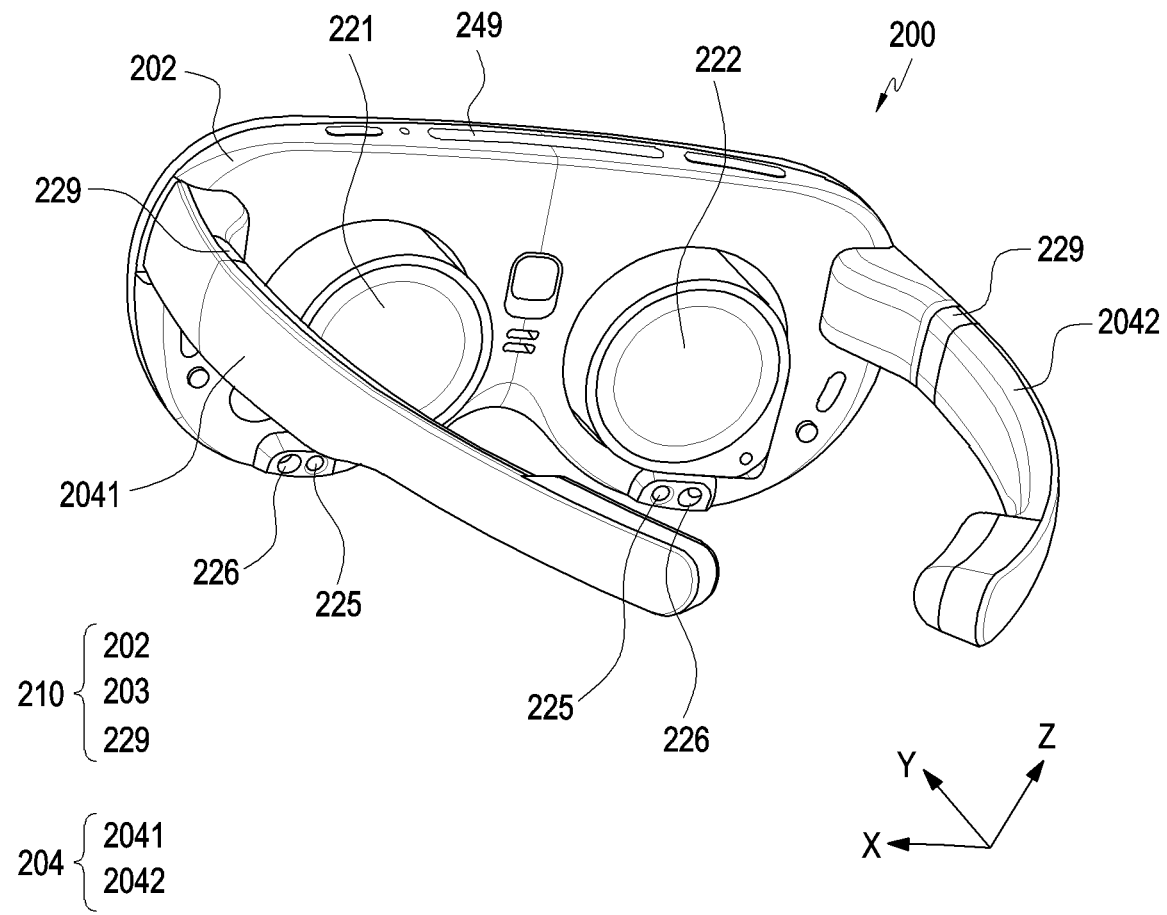
FIG. 2 is a perspective view illustrating an example wearable electronic device according to various embodiments.
Figure 3:
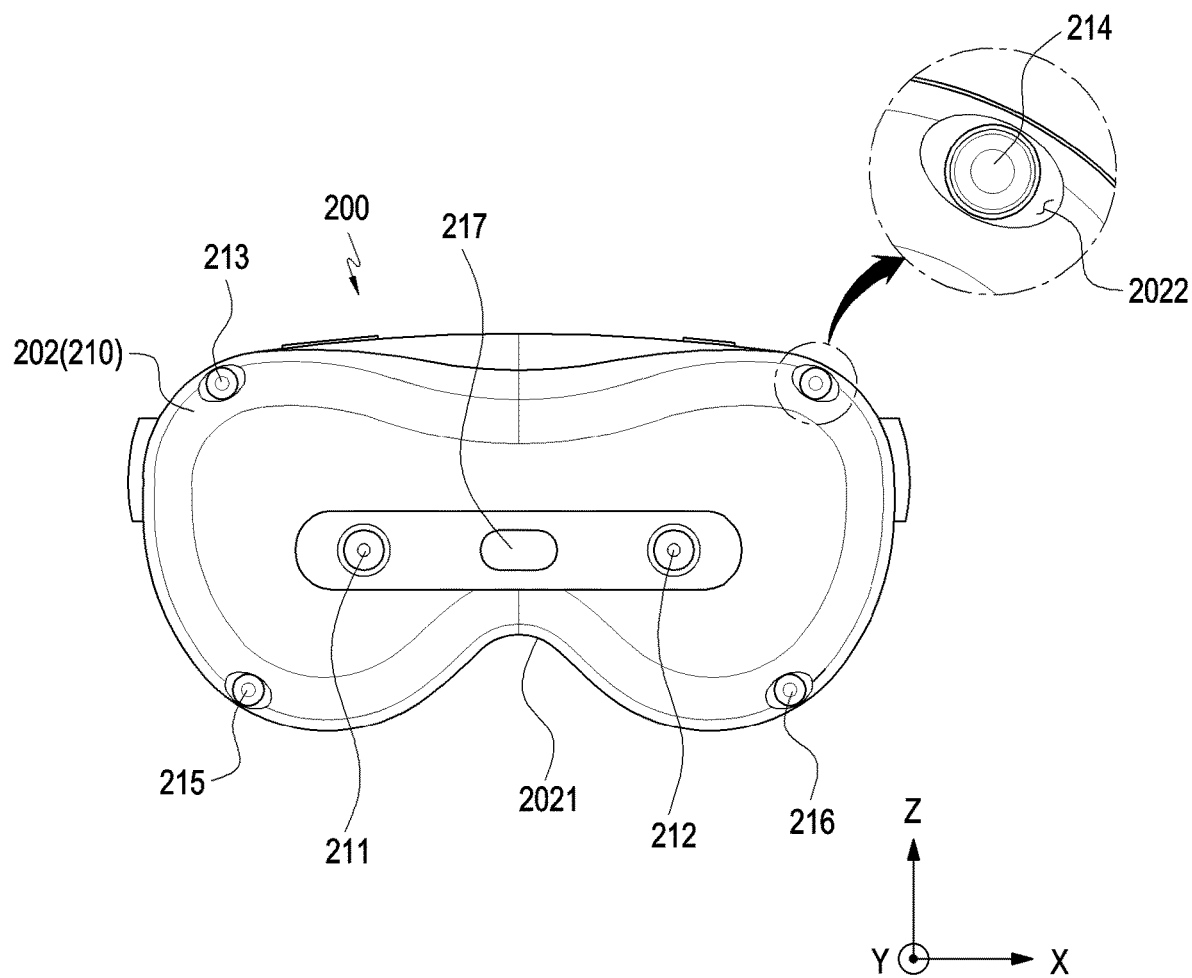
FIG. 3 is a diagram illustrating front view of the wearable electronic device according to various embodiments.

FIG. 2 is a perspective view illustrating an example wearable electronic device 200 according various embodiments. FIG. 3 is a diagram illustrating a front view of the wearable electronic device 200 according to various embodiments.

The wearable electronic device 200 of FIGS. 2 and 3 may be substantially the same as the electronic device 101 of FIG. 1 and may be implemented to be wearable on a user's body. In an embodiment, each of the external electronic devices 102 and 104 of FIG. 1 may be of the same or different type from the electronic device 101 or the wearable electronic device 200. According to an embodiment, all or part of the operations executed in the electronic device 101 or the wearable electronic device 200 may be executed in one or more of the external electronic devices 102, 104, or 108. For example, when the electronic device 101 or the wearable electronic device 200 is to perform certain functions or services automatically or in response to a request from a user or other device, the electronic device 101 or the wearable electronic device 200 may request that one or more external electronic devices perform at least part of the functions or the services, in place of or in addition to performing the functions or the services by itself. At least one external electronic device, which has received the above-mentioned request, may execute at least part of the requested functions or services, or an additional function or service associated with the request, and may deliver the result of the execution to the electronic device 101 or the wearable electronic device 200. The electronic device 101 or the wearable electronic device 200 may process the result as it is or additionally so as to provide the result at least part of the response to the request. For example, the external electronic device 102 renders content data executed by the application and then delivers the rendered content data to the electronic device 101 or the wearable electronic device 200, and the electronic device 100 or the wearable electronic device 200 receiving the data may output the content data to a display module (e.g., the first display 241 and/or the second display 242 in FIG. 4). When the electronic device 101 or the wearable electronic device 200 detects the movement of the user through an inertial measurement unit sensor, the processor (e.g., the processor 120 in FIG. 1) of the electronic device 101 or the wearable electronic device 200 may correct, based on the motion information, the rendered data received from the external electronic device 102 and may output the corrected rendered data to the display module. Alternatively, the motion information may be delivered to the external electronic device 102 and rendering may be requested such that the screen data is updated accordingly. According to various embodiments, the external electronic device 102 may be of various types, such as a case device that is capable of storing and charging the electronic device 101.

According to an embodiment, the wearable electronic device 200 may be a body-worn device. For example, the wearable electronic device 200 may, for example, and without limitation, be a head-mounted device (HMD), smart glasses, a video see-through (VST) device, or the like, capable of directly providing images directly to a user's both eyes. In the illustrated embodiments, the wearable electronic device 200 is illustrated as having the appearance of goggles, but the wearable electronic device 200 of the disclosure is not limited thereto and may have various types of appearances.

Referring to FIGS. 2 and 3, the wearable electronic device 200 may include a housing 210 that forms the appearance of the wearable electronic device 200. For example, the housing 210 may form the appearance of the wearable electronic device 200 and provide a space in which components of the wearable electronic device 200 can be arranged.

According to an embodiment, the housing 210 may include a first housing 202, a second housing 203 (see FIG. 4), or at least one wearing member 204 (e.g., a temple). In FIG. 2, for convenience of description, the wearable electronic device 200 is illustrated in the state in which the second housing 203 separated or omitted. Through the embodiment of FIG. 4 described in greater detail below, it can be easily understood that the second housing 203 is disposed on one surface of the first housing 202 and is disposed adjacent to the user's face or in direct contact with the user's face.

According to an embodiment, the first housing 202 may provide a space in which components of the wearable electronic device 200 can be arranged. For example, the first housing 202 may be referred to as a cover housing or a main housing.

According to an embodiment, the first housing 202 may include a nose pad (e.g., the nose pad 2021 in FIG. 3) which is at least partially concave. The nose pad 2021 may be located on the user's nose or supported by the user's nose.

According to an embodiment, the wearable electronic device 200 may include a display (e.g., the display module 240 in FIG. 4) that is disposed inside the first housing 210 and is capable of outputting a visual image. The display may provide a visual image to the user's left eye and/or right eye through lenses 221 and 222 (e.g., a pancake lens assembly) disposed behind the first housing 210 (e.g., in the −Y direction). In an embodiment, the lenses 221 and 222 may include a first lens 221 configured to correspond to the user's left eye, and a second lens 222 configured to correspond to the user's right eye, and may focus or guide visual information output from the display to either of the user's both eyes.

According to an embodiment, the wearable electronic device 200 may include VST camera modules 211 and 212, a plurality of camera modules 213, 214, 215, and 216, and/or an infrared (IR) camera module 217.

According to an embodiment, the camera modules 211 to 217 may be disposed on the first housing 210 or exposed to the outside of the wearable electronic device 200 through an opening provided in the first housing 210.

According to an embodiment, the VST camera modules 211 and 212 may be camera modules for video see-through (VST). For example, the wearable electronic device 200 may display at least a portion of an image related to the surrounding environment and captured through the VST camera modules 211 and 212 (or an object processed based on at least a portion of the image and/or an object corresponding to at least a portion of the image). Accordingly, the user may identify at least a portion of the image captured through the VST camera modules 211 and 212 (e.g., an image related to the surrounding environment). In an embodiment, the VST content may be generated by mixing content for a VR environment and at least a portion of the image captured through the VST camera modules 211 and 212. For example, the VST content may be generated by mixing content for a VR environment and at least a partial processing result (or a corresponding object) of an image captured through the VST camera modules 211 and 212. In an embodiment, the VST content may be generated based on at least a portion of the image captured through the VST camera modules 211 and 212. For example, the VST content may be generated based on the processing result (or corresponding object) of at least a portion of the image captured through the VST camera modules 211 and 212.

According to an embodiment, the wearable electronic device 200 may acquire a visual image for an object or environment in the direction that the user is looking at or the wearable device 200 is oriented (e.g., the Y-axis direction in FIGS. 2 and 3) using the plurality of camera modules 213, 214, 215, and 216.

According to an embodiment, the camera modules 213 and 214 may be disposed in a portion higher than the other camera modules 211, 212, 215, and 216 in the first housing 202 (or may be exposed through an opening provided in the first housing 202). The camera modules 213 and 214 may capture an image of an area or a space corresponding to an angle of view or field of view (FOV) based on at least one point of the first housing 202 (corresponding to, e.g., a relatively higher side when the user wears the wearable electronic device 200). The image acquired by the camera modules 213 and 214 may be used, for example, for simultaneous localization and mapping (SLAM) and/or 6 degrees of freedom (6 DoF), and/or for recognition and/or tracking for a subject in the captured image area or space. The image acquired by the camera modules 213 and 214 may also be used for head tracking.

According to an embodiment, the camera modules 215 and 216 may be disposed, for example, in a portion lower than the camera modules 213 and 214 on the first housing 202. Here, the "higher portion" corresponding to the camera modules 213 and 214 and the "lower portion" corresponding to the camera modules 215 and 216 are defined based on the user's viewpoint while the user is wearing the wearable electronic device 200. As defined, the portion that is relatively closer to the ground may be named the lower portion and the portion that is relatively farther from the ground may be named the higher portion. For example, when describing the positions of the camera modules 213, 214, 215, and 216, distinguishing between the higher and lower portions is for convenience of description, and the definition of these of relative positions may be appropriately changed depending on the user's wearing state, the user's posture, or the actual usage environment of the wearable electronic device. The camera modules 215 and 216 may capture an image of an area or a space corresponding to an angle of view or field of view (FOV) based on at least one point of the first housing 202 (corresponding to, e.g., a relatively lower side when the user wears the wearable electronic device 200). For example, when the camera modules 213 and 214 are defined as capturing a spatial image of the upper side of the housing 210, the camera modules 215 and 216 may be understood as capturing a spatial image of the lower side of the housing 210. An image acquired by the camera modules 215 and 216 may be used for recognition and/or tracking of a subject in the captured image area or space. For example, when a user wears the wearable electronic device 200, an image acquired by the camera modules 215 and 216 may be used for recognition and/or tracking for an image of a subject located relatively lower than a portion corresponding to the head (e.g., the user's hand). However, it is noted that the above description regarding information extracted from an image acquired by the camera modules 213, 214, 215, and 216 or its use is merely illustrative, and various embodiments of the disclosure are not limited thereto.

Meanwhile, when arranging the camera modules 213, 214, 215, and 216, their positions or orientations may be determined such that the angles of view or fields of view partially overlap. In an embodiment, the camera modules 213, 214, 215, and 216 may be arranged such that the angles of view or fields of view do not overlap. For example, it is noted that in the arrangement of the camera modules 213, 214, 215, and 216, various embodiments of the disclosure are not limited by whether the angles of view or fields of view overlap. In an embodiment, when there is an area in the direction the user is looking, but out of the angles of view of the camera modules 213, 214, 215, and 216, the camera module indicated by reference numeral "211" and/or the camera indicated by reference numeral "212" may acquire subject information in the corresponding camera module. Although not illustrated, in order to acquire images of a larger area or higher quality, the wearable electronic device 200 may further include an additional camera module disposed at a different position from the illustrated camera modules 213, 214, 215, and 216 or disposed to face a different direction from the illustrated camera module.

According to an embodiment, the wearable electronic device 200 may perform recognition and/or tracking for a subject using at least one image captured by the camera modules 213, 214, 215, and 216. The wearable electronic device 200 may perform an operation identified based on a recognition and/or tracking result, and may provide, for example, a visual object to a position corresponding to a subject, but there is no restriction on the operation. For example, when a virtual keyboard as a visual object is provided by the wearable electronic device 200, input signals corresponding to keys designated on the virtual keyboard based on the tracking result of the user's hand may be generated An operation corresponding to a recognition and/or tracking result may be performed independently by, for example, the wearable electronic device 200. However, but this is an example, and an operation may be performed based on cooperation between the wearable electronic device 200 and an external electronic device (e.g., the external electronic device 102, the electronic device 104, and/or the server 108 in FIG. 1).

According to an embodiment, the camera modules 213, 214, 215, and 216 are for 3DoF, 6DoF head tracking, hand detection, hand tracking, and/or spatial recognition, and may be global shutter (GS) cameras. However, there is no limitation, and the camera modules may also be implemented as rolling shutter (RS) cameras.

According to an embodiment, the infrared (IR) camera module 217 may include a time of flight (TOF) camera or a structured light camera. For example, the infrared camera module 217 may be operated as at least part of a sensor module (a sensor module or lidar sensor) for detecting a distance to a subject. According to an embodiment, the wearable electronic device 200 may further include a sensor module (e.g., a lidar sensor). For example, the sensor module may include at least one of a vertical cavity surface emitting laser (VCSEL), an infrared sensor, and/or a photodiode. According to an embodiment, the infrared camera module 217 may be used to identify a distance to an object (subject), like a TOF camera.

According to an embodiment, the wearable electronic device 200 may include at least one face tracking camera module 225. The face tracking camera module 225 may be used to detect and track a user's facial expression. For example, the face tracking camera module 225 may be exposed through an opening provided in the first housing 202 (and/or the second housing 203).

According to an embodiment, the wearable electronic device 200 may include at least one microphone module 226 (e.g., the input module 150 in FIG. 1). The microphone module 226 may convert sound into an electrical signal. The microphone module 226 may be used to acquire voice information. In an embodiment, the microphone module 226 may be exposed through an opening provided in the first housing 202.

According to an embodiment, the second housing 203 may be a portion that comes into contact with the user's face when the user wears the wearable electronic device 200. For example, while the user is wearing the wearable electronic device 200, the second housing 203 may be disposed between the first housing 202 and the user's face. In addition, the second housing 203 may be configured such that at least a portion of the second housing 203 is curved to correspond to the curves of the user's face (e.g., the forehead or cheekbones).

According to an embodiment, when the user wears the wearable electronic device 200, the second housing 203 may block external light from reaching the user's eyes by being in contact with the user's face. The second housing 203 may be referred to as a face cover or a cover housing. In an embodiment, the second housing 203 may be detachably coupled to the rear surface of the first housing 202.

According to an embodiment, at least one wearing member 204 may extend from an end portion of the first housing 202 and may be supported or located on the user's body (e.g., an ear). According to an embodiment, the at least one wearing member 204 may include a first wearing member 2041 supported by the user's left ear and a second wearing member 2042 supported by the user's right ear.

According to an embodiment, the housing 210 may further include at least one hinge structure 229. According to an embodiment, the at least one wearing member 204 may be rotatably coupled to the first housing 210 via the at least one hinge structure 229. The at least one hinge structure 229 may be disposed between the first housing 202 and the at least one wearing member 204. When not wearing the wearable electronic device 200, the user may fold at least a portion of the wearing member 204 to overlap the first housing 202 to carry or store the wearable electronic device 200.

According to an embodiment, the plurality of camera modules 213, 214, 215, and 216 may each be disposed adjacent to an edge area of the first housing 202. For example, the plurality of camera modules 213, 214, 215, and 216 may each be disposed at a corner of the first housing 202 to secure a wide angle of view or field of view. According to an embodiment, the plurality of camera modules 213, 214, 215, and 216 are exposed to the outside of the wearable electronic device 200 through openings (e.g., the opening 2022 in FIG. 3) provided at the corners of the first housing 202.

According to an embodiment, the wearable electronic device 200 and/or the first housing 202 may further include at least one air vent 249. The air vent 249 is provided to penetrate, for example, a portion of one surface and/or the side surface of the first housing 202 to enable the flow or distribution of fluid (e.g., air) between the inner space and the outer space of the first housing 202. In an embodiment, the air vent 249 may be an elongated hole formed along one direction (e.g., the X-axis direction) at the upper end of the first housing 202. In an embodiment, a plurality of air vents 249 may be arranged along one direction at the upper end of the first housing 202. Although not illustrated, the wearable electronic device 200 may further include a filter member disposed in the air vent 249, thereby allowing air to flow through the air vent 249 and preventing and/or reducing foreign substances such as dust from flowing into the first housing 202.

According to an embodiment, various electronic components disposed inside the wearable electronic device 200 include heat generation components such as a processor (e.g., the processor 120 in FIG. 1) or a display (e.g., the display module 160 in FIG. 1). Heat generated inside the wearable electronic device 200 (e.g., inside the first housing 202) may impair the operating environment of the processor or the display, and a heat generation phenomenon may increase when the operating environment becomes poor. When the wearable electronic device 200 comes into contact with the user's body (e.g., the face) while the generated heat is accumulated, it may cause discomfort to the user or cause injuries such as low-temperature burns. According to one or more embodiments of the disclosure, the air vent 249 discharges at least the air inside the first housing 202 (e.g., heat generated from heat generation components) to the outside and/or allows the outside air to flow into the first housing 202, thereby suppressing or alleviating an increase in the internal temperature of the wearable electronic device 200. Although not illustrated, in allowing the outside air to flow into the first housing 202, the wearable electronic device 200 may further include an additional hole provided at a position different from the air vent 249.

Figure 4:
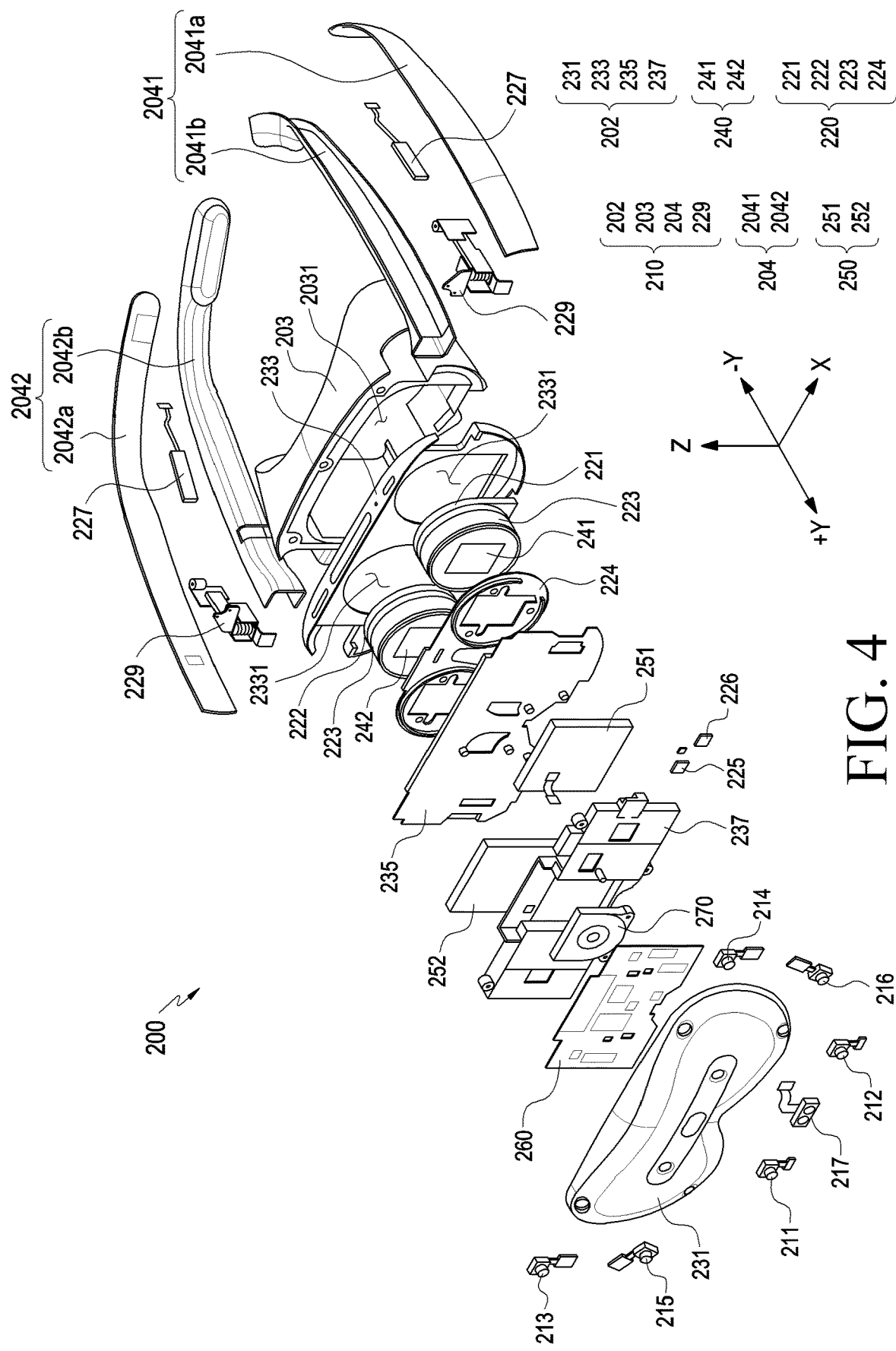
FIG. 4 is an exploded perspective view illustrating a wearable electronic device according to various embodiments.

FIG. 4 is an exploded perspective view illustrating an example wearable electronic device 200 according to various embodiments.

The wearable electronic device 200 of FIG. 4 may be at least partially similar to the electronic device 101 or the wearable electronic device 200 of FIGS. 1, 2 and 3, or may be substantially the same as the electronic device 101 or the wearable electronic device 200 of FIGS. 1, 2 and 3. When describing the wearable electronic device 200 of FIG. 4, for components that can be easily understood from prior embodiments, the same reference numerals may be assigned or omitted, and detailed descriptions thereof may also not be repeated here.

Referring to FIG. 4, the wearable electronic device 200 may include a housing 210, camera modules 211, 212, 213, 214, 215, 216, 217, and 225, a lens assembly 220, a display module 240, a battery 250, a circuit board 260, a microphone module 226, or a speaker module 227.

The configurations of the wearable electronic device 200, the housing 210, and the camera modules 211, 212, 213, 214, 215, 216, 217, and 225 of FIG. 4 may be wholly or partly the same as those of the wearable electronic device 200, the housing 210, and the camera modules 211, 212, 213, 214, 215, 216, 217, and 225 of FIGS. 2 and 3.

According to an embodiment, the housing 210 of the wearable electronic device 200 may include a first housing 202 (e.g., the first housing 202 in FIGS. 2 and 3), a second housing 203, and at least one wearing member 204 (e.g., the at least one wearing member 204 in FIGS. 2 and 3), or at least one hinge structure 229 (e.g., the at least one hinge structure 229 in FIGS. 2 and 3).

According to an embodiment, the first housing 202 may include a front case 231, a rear case 233, a display support member 235, or a battery support member 237.

According to an embodiment, the appearance of the first housing 202 may be formed by coupling the front case 231 and the rear case 233 to each other. In addition, the inner space of the first housing 202 may be a space formed between the front case 231 and the rear case 233 when the front case 231 and the rear case 233 are coupled to each other. According to an embodiment, various electrical components may be disposed in the inner space of the first housing 202.

According to an embodiment, the front case 231 is a case disposed in the direction where the user's face or the wearable electronic device 200 is oriented (e.g., the +Y direction in FIG. 4) when the user wears the wearable electronic device 200. In an embodiment, a plurality of openings may be provided in the front case 231. A plurality of camera modules 211, 212, 213, 214, 215, 216, and 217 may be disposed in the plurality of openings.

According to an embodiment, the rear case 233 may be a case disposed in a direction toward the user's face (e.g., the −Y direction in FIG. 4) when the user wears the wearable electronic device 200. In an embodiment, at least one first through hole 2331 configured to accommodate one or more lens barrels 223 of the lens assembly 220 may be provided in the rear case 233. In addition, in the second housing 203 coupled to the rear case, a pair of second through holes 2031 corresponding to a pair of first through holes 2331 in the rear case 233 may be provided.

According to an embodiment, the display support member 235 may be disposed between the front case 231 and the rear case 233. The display support member 235 may also be referred to as a "display bracket". In addition, the display support member 235 may be disposed between the rear case 233 and the battery support member 237. In an embodiment, the display support member 235 may support the display module 240 within the first housing 202. For example, the display module 240 may be disposed on one surface of the display support member 235.

According to an embodiment, the battery support member 237 may be disposed between the front case 231 and the rear case 233. The battery support member 237 may also be referred to as a "battery bracket". In addition, the battery support member 237 may be disposed between the front case 231 and the display support member 235. In an embodiment, the battery support member 235 may provide a space configured to accommodate the battery 250 or a structure for supporting (or fixing) the battery 250 within the first housing 202. For example, the battery 250 may be accommodated (or fixed) in a recess provided by the battery support member 235.

According to an embodiment, the at least one wearing member 204 may include a first wearing member 2041 worn on the user's left ear and a second wearing member 2042 worn on the user's right ear. In an embodiment, the first wearing member 2041 may include an outer cover 2041a and an inner cover 2041b, and the second wearing member 2042 may include an outer cover 2042a and an inner cover 2042b. For example, the inner covers 2041b and 2042b are configured to face or directly come into contact with the user's body, and may be made of a material with low thermal conductivity such as a synthetic resin. In an embodiment, the outer covers 2041a and 2042a are configured to face outward from the user's body, wherein the outer covers may not come into contact with the user's body, may at least partially include a material (e.g., a metal material) that is capable of transferring heat, may be coupled to face the inner covers 2041b and 2042b. In an embodiment, the speaker module 247 may be disposed in a space implemented by coupling the outer covers 2041a and 2042a and the inner covers 2041b and 2042b to each other.

According to an embodiment, the first wearing member 2041 and the second wearing member 2042 may be rotatably coupled to the first housing 210 via a plurality of hinge structures 229. For example, the first wearing member 2041 and the second wearing member 2042 may each be folded and superimposed on the first housing 210 by being rotated about a corresponding one of the hinge structures 229, or may be unfolded by a predetermined angle from the first housing 210.

According to an embodiment, the lens assembly 220 may include a pair of barrels 223, lenses 221 and 222, and a lens bracket 224. The lens assembly 220 (e.g., the lenses 221 and 222) may guide or focus light or visual information output from the display module 240 to at least one of the user's both eyes. For example, the lens assembly 220 (e.g., the lenses 221 and 222) may be configured to allow the user to visually recognize information output from the display module 240 even in the state in which the display module 240 is located fairly close to the user's both eyes (e.g., within a distance of about 5 cm).

According to an embodiment, the pair of lens barrels 223 of the lens assembly 220 may be disposed in one of the first through holes 2331 in the rear case 233 and one of the second through holes 2031 in the second housing 203. For example, the lens barrels 223 may arrange the lenses 221 and 222 to substantially face the display module 240 and visually expose the lenses 221 and 222 to the outer space. In an embodiment, the pair of barrels 223 may be fixed to the lens bracket 224. As a result, the first lens 221 (e.g., the first lens 221 in FIG. 2) and the second lens 222 (e.g., the second lens 222 in FIG. 2) may be disposed in the pair of barrels 223, respectively, to substantially directly face the user's eyes. In an embodiment, the lens bracket 224 may be coupled to one surface (e.g., the surface oriented in the −Y direction in FIG. 4) of the display support member 235.

According to an embodiment, the display module 240 (e.g., the display module 160 in FIG. 1) may provide information to the outside of the wearable electronic device 200 (e.g., the user's eyes) in the form of a visual image through the lens assembly 220. For example, the display module 240 may include, for example, a liquid crystal display (LCD), a digital mirror device (DMD), a liquid crystal on silicon (LCoS) device), an organic light-emitting diode (OLED), or a micro light-emitting diode (LED). Although not illustrated, when the display module 240 is made of one of a liquid crystal display device, a digital mirror display device, or a silicon liquid crystal display device, the wearable electronic device 200 may include a light source that emits light to a screen output area of the display module 240. In an embodiment, when the display 240 is capable of generating light by itself, for example, when the display 202 includes one of organic light-emitting diodes or micro LEDs, the electronic device 200 may provide a user with a virtual image with good quality even if the wearable electronic device 200 does not include a separate light source. In an embodiment, when the display module 240 is implemented with organic light-emitting diodes or micro LEDs, the wearable electronic device 200 may be reduced in weight because the light source is not required.

According to an embodiment, the display module 240 may include a first display 241 corresponding to the user's left eye and the first lens 221 and a second display 242 corresponding to the user's right eye and the second lens 222. For example, the first display 241 provides visual information to one of the user's both eyes (e.g., the left eye) through the first lens 221, and the second display 242 provides visual information to the other of the user's both eyes (e.g., the right eye) through the second lens 222. In providing visual information to the user's both eyes, light or visual information output from the display module 240 may be guided or focused by the first lens 221 or the second lens 222.

According to an embodiment, the battery 250 (e.g., battery 189 in FIG. 1) may provide a power source (or power) to the components of the wearable electronic device 200. According to an embodiment, the battery 250 may include a power management module (e.g., the power management module 188 in FIG. 1). In an embodiment, the battery 250 may include a first battery 251 and a second battery 252. In an embodiment, each of the first battery 251 and the second battery 252 may be electrically connected to a circuit board 260 via a separate power transmission structure (e.g., a conductive wire, or an FPCB).

According to an embodiment, the circuit board 260 (e.g., a PCB) may include components for driving the wearable electronic device 200. For example, the circuit board 260 may include at least one integrated circuit chip (e.g., the integrated circuit chip 369 in FIG. 5, which will be described in greater detail below), and at least one of a processor (e.g., the processor 120 in FIG. 1), memory (e.g., the memory 130 in FIG. 1), a power management module (e.g., the power management module 188 in FIG. 1), or a communication module (e.g., the communication module 190 in FIG. 1) may be incorporated in the integrated circuit chip. In an embodiment, the circuit board 260 may be disposed inside the first housing 210. For example, the circuit board 260 may be disposed between the front case 231 and the battery support member 237.

According to an embodiment, the circuit board 260 may be connected to a flexible printed circuit board (FPCB) and may transmit electrical signals to electronic components (e.g., the camera modules 211, 212, 213, 214, 215, 216, 217, and 225, the microphone module 226, the speaker module 227, or the display module 240). According to an embodiment, the circuit board 260 may include a circuit board including an interposer.

According to an embodiment, the wearable electronic device 200 may further include at least one fan module 270. The fan module 270 may be referred to as, for example, a "heat dissipation fan", an "air ventilating fan", and/or a "blower fan". The at least one fan module 270 may be disposed between the battery support member 237 and the circuit board 260. In an embodiment, the at least one fan module 270 generates a flow of air inside the first housing 202 to discharge the air inside the wearable electronic device 200 (e.g., the first housing 202) to the outside.

According to an embodiment, when the internal temperature of the first housing 202 is higher than a predetermined temperature, or when electrical components (e.g., the battery 250 or the circuit board 260) is higher than a predetermined temperature, the at least one fan module 270 may generate a flow of air to lower the internal temperature of the first housing 202 or the temperature of the electrical components. For example, when the at least one fan module 270 operates, heat generated from electronic components such as a processor or a display (e.g., the display module 240) may be discharged to the outside of the wearable electronic device 200 (e.g., the first housing 202). As mentioned earlier, the air inside the wearable electronic device 200 or the heat accumulated inside the wearable electronic device 200 is discharged to the outside through the air vent (e.g., the air vent 249 in FIG. 2) provided on the upper end of the first housing 202. For example, the air vent may allow fluid to flow between the inside and the outside of the first housing 202, and the fan module 270 may operate to promote the discharge of heat accumulated inside the wearable electronic device 200.

According to an embodiment, the face tracking camera module 225 may be placed in an opening provided in the rear case 233.

According to an embodiment, the microphone module 226 (e.g., the input module 150 in FIG. 1) may be placed in an opening provided in the rear case 233. The microphone module 226 may convert sound into an electrical signal. For example, the wearable electronic device 200 (e.g., the processor 120 in FIG. 1) may distinguish voice information and surrounding noise based on voice information and/or additional information (e.g., low-frequency vibrations of the user's skin and bones) acquired through at least one microphone module 226. For example, the wearable electronic device 200 may clearly recognize the user's voice and may perform a function of reducing ambient noise (e.g., noise canceling).

According to an embodiment, at least one speaker module 227 (e.g., the sound output module 155 in FIG. 1) may convert an electrical signal into sound. The speaker module 227 according to an embodiment may be at least partially disposed within a wearing member 204 of the housing 210. For example, the speaker module 227 may be disposed inside at least one wearing member 204 to be placed adjacent to the user's ear. In an embodiment, the speaker module 227 may be disposed on both a first wearing member 2041 and a second wearing member 2042, or on one of the first and second wearing members 2041 and 2042.

According to an embodiment, when the display module 240 (e.g., the first display 241 and the second display 242) provides images with higher resolution, the realism of visual information perceived by the user may increase. When providing a high-resolution image, heat generated from the processor (e.g., the processor 120 of FIG. 1), the display module 240, and/or a display driving circuit may increase. The wearable electronic device 200 according to one or more embodiments of the disclosure may include a heat dissipation structure corresponding to heat generation components such as the display module 240 or the processor, thereby providing a comfortable use environment for the user while a high-resolution image. In the detailed description below, when discussing the heat dissipation structure of the wearable electronic device 200, the configurations of the above-described embodiments may be referred to.

Figure 5:
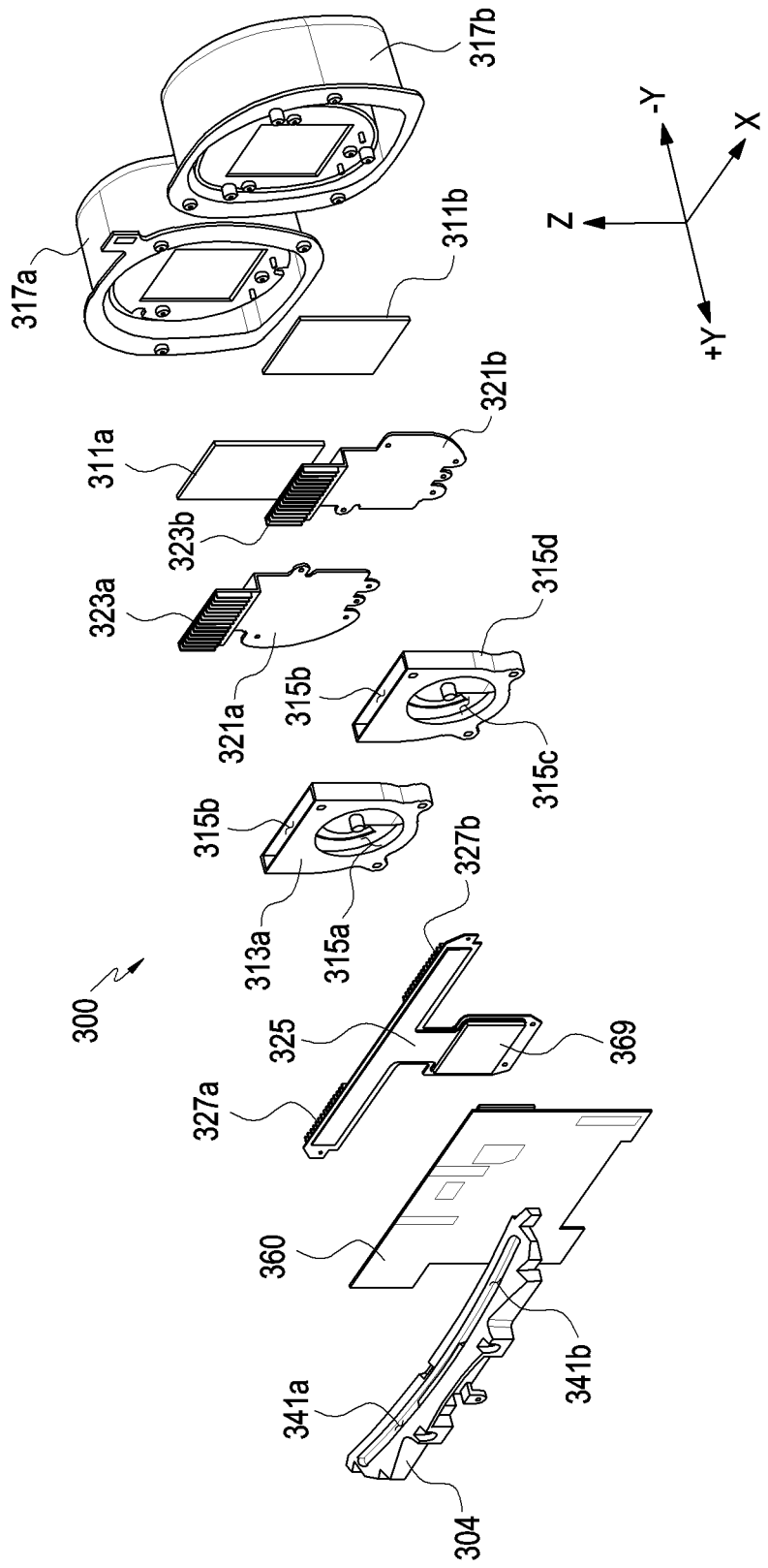
FIG. 5 is an exploded perspective view illustrating an example heat dissipation structure of a wearable electronic device according to various embodiments.
Figure 6:
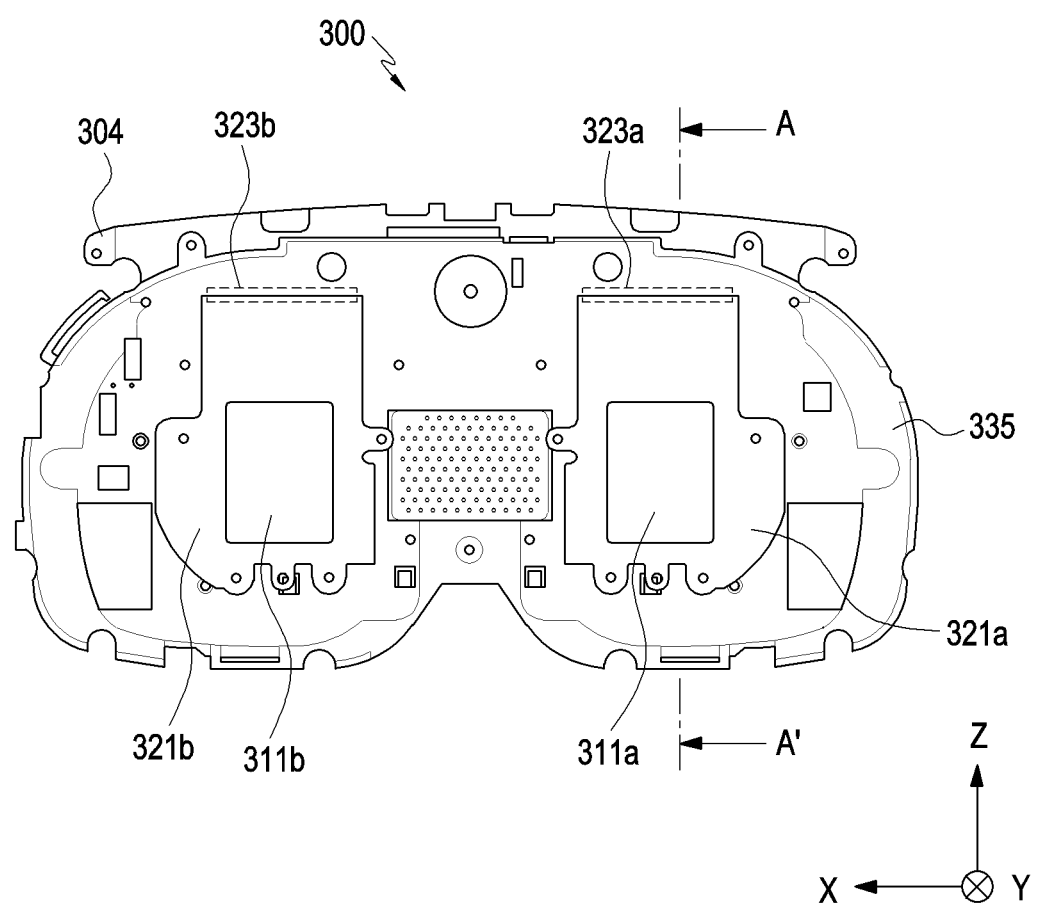
FIG. 6 is a diagram illustrating a rear view of a heat dissipation structure of a wearable electronic device according to various embodiments.
Figure 7:
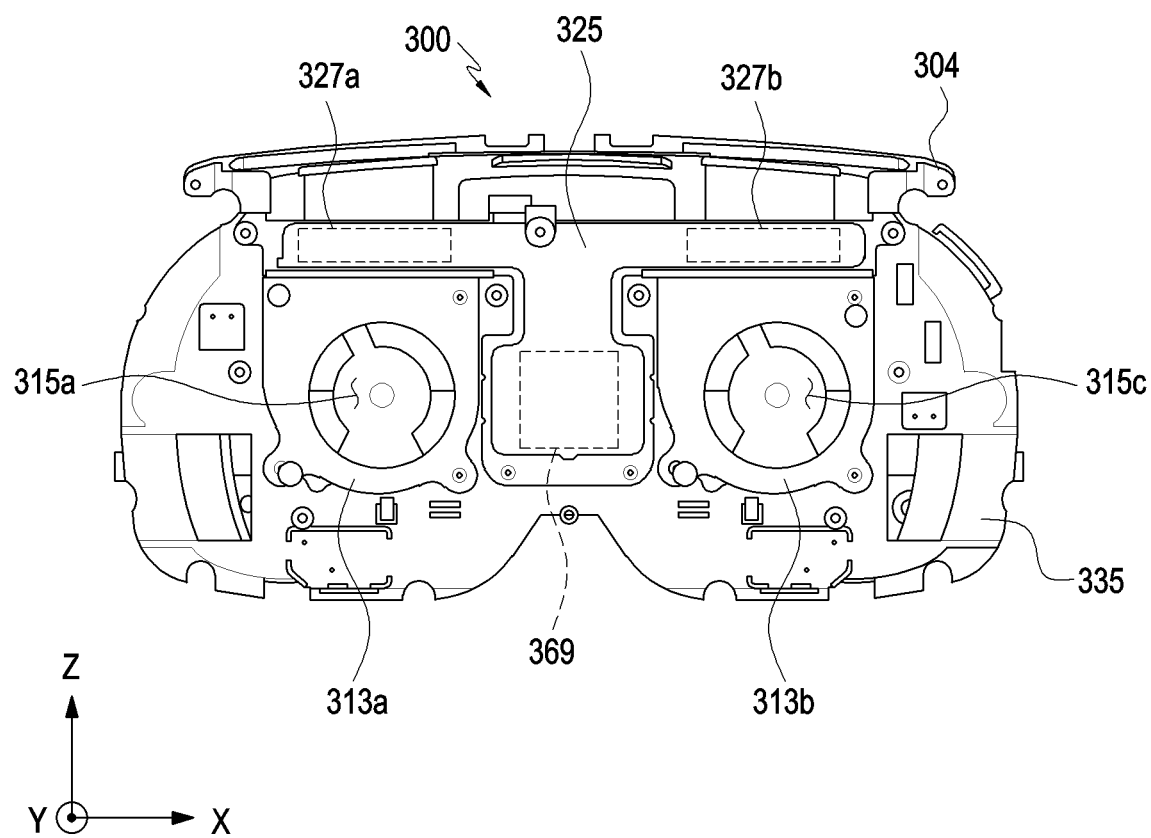
FIG. 7 is a diagram illustrating a front view of an example heat dissipation structure of a wearable electronic device according to various embodiments.

FIG. 5 is an exploded perspective view illustrating an example heat dissipation structure 300 of a wearable electronic device (e.g., the wearable electronic device 200 in FIG. 4) according to various embodiments. FIG. 6 is a diagram illustrating a rear view of the heat dissipation structure 300 of the wearable electronic device 200 according to various embodiments. FIG. 7 is a diagram illustrating a front view of the heat dissipation structure 300 of the wearable electronic device 200 according to various embodiments.

Referring to FIGS. 5, 6 and 7, the wearable electronic device (e.g., the electronic device 101 in FIG. 1 or the wearable electronic device 200 in FIGS. 2 to 4) according to one or more embodiments of the disclosure may include a heat dissipation structure 300 corresponding to at least one of a first display 311a (e.g., the first display 241 in FIG. 4) and/or a second display 311b (e.g., the second display 242 in FIG. 4). In an embodiment, the heat dissipation structure 300 may provide a heat dissipation path corresponding to the second display 311b while providing a heat dissipation path corresponding to the first display 311a.

According to an embodiment, the first display 311a and/or the second display 311b may be easily aligned with lenses (e.g., the lenses 221 and 222 in FIG. 4) by being disposed substantially on the lens assemblies 317a and 317b (e.g., pancake lens assemblies). In an embodiment, the heat dissipation structure 300 may be implemented substantially above the display support member 335 (e.g., the display support member 235 in FIG. 4). For example, the first heat conductive member 321a and the second heat conductive member 321b may be assembled on one surface (e.g., the surface oriented in the −Y direction) of the display support member 335, and the heat dissipation fans 313a and 313b and the third heat conductive member 325 may be assembled on the other surface (e.g., the surface oriented in the +Y direction) of the display support member 335. The first heat conductive member 321a and the second heat conductive member 321b may be provided with heat dissipation fins 323a and 323b disposed to penetrate the display support member 335. For example, when the first heat conductive member 321a and the second heat conductive member 321b are disposed on a different surface from the heat dissipation fans 313a and 313b on the display support member 335, the heat of the first heat conductive member 321a and the second heat conductive member 321b may be transferred to the area (or space) where the heat dissipation fans 313a and 313b are disposed by disposing the heat dissipation fins 323a and 323b.

According to an embodiment, the heat dissipation structure 300 may include, for example, the heat dissipation fans 313a and 313b (e.g., the fan module 270 in FIG. 4), the heat conductive members 321a and 321b, and/or the heat dissipation fins 323a and 323b. In an example described in greater detail below, among the heat dissipation fans 313a and 313b, the heat conductive members 321a and 321b, and/or the heat dissipation fins 323a and 323b, for the components corresponding to the first display 311a, the ordinal number the ordinal number, "first", may be written together, and the components corresponding to the second display 311b, the ordinal number, "second", may be written together. The displays 311a and 311b, the heat dissipation fans 313a and 313b, the heat conductive members 321a and 321b, and/or the heat dissipation fins 323a and 323b may be substantially identical to each other and arranged symmetrically with respect to each other. For example, when disposing the heat dissipation structure 300 within the first housing (e.g., the first housing 202 in FIG. 4), the center of gravity of the wearable electronic device 200 may be prevented/inhibited from being biased. In the embodiment which will be described in greater detail below, the configuration of heat dissipation paths corresponding to the first display 311a among the heat dissipation fans 313a and 313b, the heat conductive members 321a and 321b, and/or the heat dissipation fins 323a and 323b will be described as an example, and a detailed description of the configuration of heat dissipation paths corresponding to the second display 311b may be omitted. However, as mentioned above, the heat dissipation paths corresponding to the first display 311a and the heat dissipation paths corresponding to the second display 311b may be arranged symmetrically with respect to each other, but may be substantially the same. Therefore, a person ordinarily skilled may easily understand the heat dissipation structures corresponding to the second display 311b through the following detailed description of the heat dissipation structures corresponding to the first display 311a.

Figure 10:
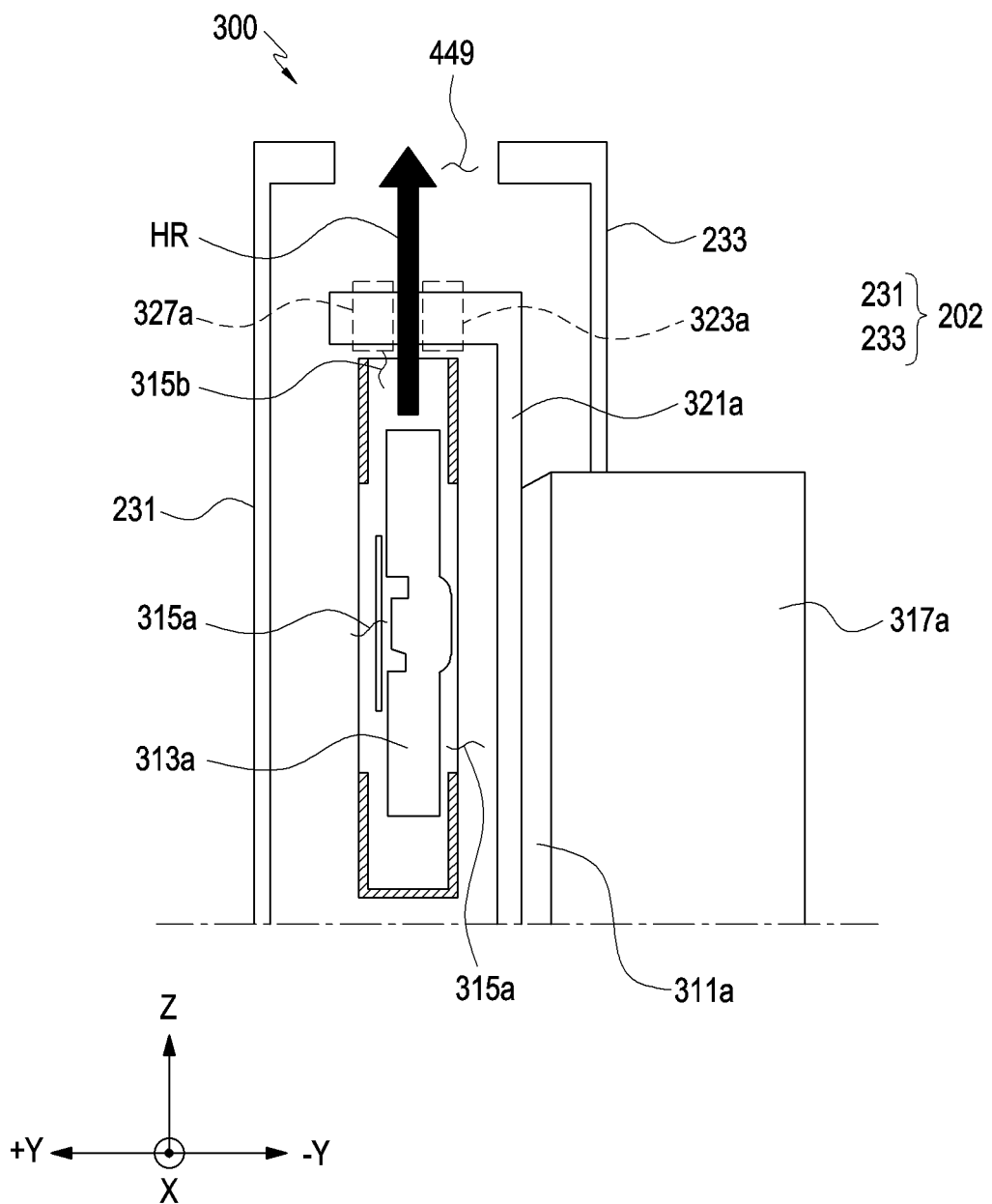
FIG. 10 is a cross-sectional view illustrating the flow of heat or air inside a first housing in the heat dissipation structure of FIG. 9 according to various embodiments.

According to an embodiment, the first heat dissipation fan 313a may be disposed to at least partially face the first display 311a and may force a flow of air (e.g., a flow of air or heat in the direction indicated by "HR" in FIG. 10) in a direction toward at least a portion of an air vent (e.g., the air vent 249 in FIG. 2) inside the first housing 202. For example, when the first heat dissipation fan 313a (and/or the second heat dissipation fan 313b) operates, at least some of the air inside the first housing 202 may be suctioned into the first heat dissipation fan 313a and then discharged to the outer space of the first housing 202 through the air vent 249. Here, when it is described that "the first heat dissipation fan 313a faces the first display 311a", it may refer, for example, to the first heat dissipation fan 313a and the first display 311a being sequentially aligned in the +/−Y-axis direction. In an embodiment, the first heat dissipation fan 313a may include at least one suction port 315a provided in a surface oriented in the −Y direction (e.g., the surface facing the first display 311a) and/or the surface oriented in the +Y direction. Although not illustrated, the first heat dissipation fan 313a may further include a suction port provided in a surface oriented in the −Z direction. For example, the first heat dissipation fan 313a may suction the air inside the first housing 202 through the suction port 315a. In an embodiment, the first heat dissipation fan 313a may include at least one discharge port 315b disposed in a direction toward the air vent 249. For example, the first heat dissipation fan 313a suctions the air inside the wearable electronic device 200 through the suction port 315a and discharges the air to the outside of the first housing 202 through the discharge port 315b and/or the air vent 249. Here, "the air inside the wearable electronic device 200 or the first housing 202" may refer to heat generated by heat generation components or air heated by the heat.

According to an embodiment, the relative positions and numbers of suction ports 315a and discharge ports 315b, which will be described in greater detail below, may be appropriately selected in consideration of the air flow and heat dissipation efficiency inside the first housing 202. For example, when the discharge port 315b is disposed to face the upper end of the first housing 202, the suction port 315a may be disposed to face the lower end of the first housing 202. In an embodiment, outside air may be allowed to flow into the first housing 202. For example, when the air and heat inside the first housing 202 are discharged to the outside due to the operation of the first heat dissipation fan 313a, the outside air may flow into the inside of the first housing 202 and may further effectively lower the temperature of the wearable electronic device 200.

According to an embodiment, the second heat dissipation fan 313b may include a suction port 315c and a discharge port 315d, and may be disposed to be adjacent to and/or to at least partially face the second display 311b, thereby causing heat generated in the second display 311b to be quickly transferred, dissipated, or discharged to the outside of the first housing 202. The configuration of the second heat dissipation fan 313b or the arrangement of the second heat dissipation fan 313b with respect to the second display 311b may be similar to the configuration or arrangement of the first heat dissipation fan 313a.

According to an embodiment, the first heat dissipation fan 313a may be disposed to be adjacent to and/or to at least partially face the first display 311a, thereby causing heat generated in the first display 311a to be quickly transferred, dissipated, or discharged to the outside of the first housing 202. For example, the first heat dissipation fan 313a includes a suction port 315a in the surface oriented in the −Y direction, thereby suctioning air around the first display 311a so that heat generated while the first display 311a operates can be quickly moved or dissipated. For example, by operating the first heat dissipation fan 313a, the temperature of the first display 311a can be suppressed from rising.

According to an embodiment, in the structure in which one fan module 270 is disposed as in the embodiment illustrated in FIG. 4, when visual information is output, the temperature of the first display 241 and/or the second display 242 was measured to rise to about 81 degrees Celsius. In the wearable electronic device 200 equipped with a display and a fan module of the same specifications, for example, when the first heat dissipation fan 313a and/or the second heat dissipation fan 313b was provided as in the heat dissipation structure 300 illustrated in FIG. 5, it was identified that the temperature of the first display 311a and/or the second display 311b was suppressed to about 68 degrees Celsius. For example, the wearable electronic device 200 according to one or more embodiments of the disclosure may provide a comfortable use environment by providing the heat dissipation structure 300 corresponding to each of the first display 311a and/or the second display 311b. The above-mentioned values mentioned about the temperature of the display are merely examples, and may vary depending on whether the heat conductive members 321a and 321b and the heat dissipation fins 323a and 323b are disposed and/or the specifications of the displays 311a and 311b and the heat dissipation fans 313a and 313b.

According to an embodiment, the first heat conductive member 321a may be disposed between the first display 311a and the first heat dissipation fan 313a. For example, the first heat dissipation fan 313a may be disposed to at least partially face the first display 311a with the first heat conductive member 321a interposed therebetween. The first heat conductive member 321a may include, for example, a heat pipe, a vapor chamber, and/or a heat conductive plate. The term "thermal conductive plate" may refer to a plate made of a material with a thermal conductivity of about 200 W/(m*K) or more. For example, copper (Cu) may have a thermal conductivity of about 401 W/(m*K), and the heat conductive members (e.g., the heat conductive members 321a, 321b, and 325 in FIG. 5) according to an embodiment of the disclosure can be implemented by a plate made of copper. In an embodiment, the first heat conductive member 321a may be partially in direct contact with a heat generation component (e.g., the first display 311a) or may be connected to the heat generation component via thermal grease or a heat sink. For example, the first heat conductive member 321a may absorb heat from a heat generation component and may dissipate or move the heat to another area or a wider area. The configuration of the second heat conductive member 321b or the arrangement of the second heat conductive member 321b with respect to the second display 311b may be similar to the configuration or arrangement of the first heat conductive member 321a.

According to an embodiment, the first heat dissipation fin 323a may be provided at one end portion of the first heat conductive member 321a and may be disposed on a movement path of air discharged by the first heat dissipation fan 313a. For example, the first heat dissipation fin 323a may be at least partially disposed between the first heat dissipation fan 313a (e.g., the discharge port 315b) and the air vent 249 in the first housing 202. In an embodiment, the first heat dissipation fin 323a may be implemented as a portion of the first heat conductive member 321a and may include a plurality of blades or a plurality of thin plates. For example, the first heat dissipation fin 323a may provide a large contact area with air circulating therearound, thereby promoting heat exchange with the air. In an embodiment, the heat dissipated or moved through the first heat conductive member 321a may reach the first heat dissipation fin 323a and heat the surrounding air.

According to an embodiment, in the path leading to the first heat dissipation fin 323a via the first heat conductive member 321a, the heat generated by the first display 311a may be discharged into the air, for example, to the inner space of the first housing 202 through a portion of the first heat conductive member 321a before reaching the first heat dissipation fin 323a. For example, heat generated from a heat generation component such as the first display 311a may be discharged to the surroundings while being dissipated or moved through the first heat conductive member 321a and the first heat dissipation fin 323a. In an embodiment, the first heat dissipation fan 313a and/or the second heat dissipation fan 313b may suction the air inside the first housing 202 and discharge the heat to the outside of the first housing 202 through the discharge ports 315b and 315d and/or the air vent 249. In an embodiment, the discharge ports 315b and 315d of the first heat dissipation fan 313a and/or the second heat dissipation fan 313b may cause air to be discharged to the outside of the first housing 202 through the air vent 249 while cooling the first heat dissipation fin 323a and/or the second heat dissipation fin 323b.

According to an embodiment, the first heat dissipation fan 313a may force the air suctioned through the suction port 315a to flow toward the air vent 249. For example, the air discharged through the discharge port 315b of the first heat dissipation fan 313a may be discharged through the air vent 249 via the periphery of the first heat dissipation fin 327a, thereby causing the heat generated in a heat generation component (e.g. the first display 311a) to be discharged to the outside of the first housing 202. The first heat dissipation fan 313a may cause the air inside the first housing 202 to be discharged to the outside, thereby suppressing heat accumulation inside the wearable electronic device 200. In an embodiment, the first heat conductive member 321a and/or the first heat dissipation fin 323a may absorb heat from a heat generation component and may discharge the heat on the movement path of the air discharged by the first heat dissipation fan 313a, thereby further suppressing heat accumulation inside the wearable electronic device 200. For example, the heat dissipation structure 300 may suppress the temperature inside the first housing 202 and/or the temperature of the first display 311a from increasing, so that the operating environment of various electronic components of the wearable electronic device 200 can be stabilized and the use environment of the wearable electronic device 200 can be made comfortable. The configuration of the second heat dissipation fin 323b or the arrangement of the second heat dissipation fin 323b with respect to the second display 311b may be similar to the configuration or arrangement of the first heat dissipation fin 323a.

According to an embodiment, the wearable electronic device 200 and/or the heat dissipation structure 300 may further include at least one enclosure 304 disposed inside the first housing 202. The enclosure 304 may be disposed, for example, between the discharge ports 315b and 315d of the heat dissipation fans 313a and 313b and the air vent 249. For example, the enclosure 304 may define at least a portion of the space connected to the air vent 249 inside the first housing 202. In an embodiment, the enclosure 304 may function as a guide structure or duct structure that defines the movement path of air from discharge ports 315b and 315d to the air vent 249. For example, the enclosure 304 may guide the air discharged from the inner space of the wearable electronic device 200 to the outside by the first heat dissipation fan 313a and/or the second heat dissipation fan 313b, into the air vent 249. In an embodiment, the enclosure 304 may include duct holes 341a and 341b to receive air from the first heat dissipation fan 313a or the second heat dissipation fan 313b and to guide the air to the vent hole 249 or the outer space of the first housing 202. In an embodiment, the duct holes 341a and 341b may be directly connected to the air vent 249 or may be substantially exposed to the outer space of the first housing 202 through the air vent 249.

According to an embodiment, when the air moving to the air vent 249 by the first heat dissipation fan 313a (and/or the second heat dissipation fan 313b) is not discharged to the outside (e.g., when flowing back into the inside of the housing 202), the efficiency in dissipating heat inside the wearable electronic device 200 may decrease. In an embodiment, the enclosure 304 within the first housing 202 may isolate a path through which heat discharged by, for example, the first heat dissipation fan 313a (and/or the second heat dissipation fan 313b) moves, from another area (or a space) inside the first housing 202, so that backflow of heated air can be suppressed. When "the area (or space) inside the first housing 202 that is different from the path through which the heat discharged by the first heat dissipation fan 313a moves" may refer to the space in which the integrated circuit chip 369 and/or the displays 311a and 311b are disposed. When the enclosure 304 is provided, the first heat dissipation fan 313a and/or the second heat dissipation fan 313b may suction air from the space in which the integrated circuit chip 369 and/or displays 311a and 311b are disposed, and may discharge the air to the space outside the wearable electronic device 200 (e.g., the first housing 202) sequentially via the enclosure 304 and the air vent 249.

Figure 11:
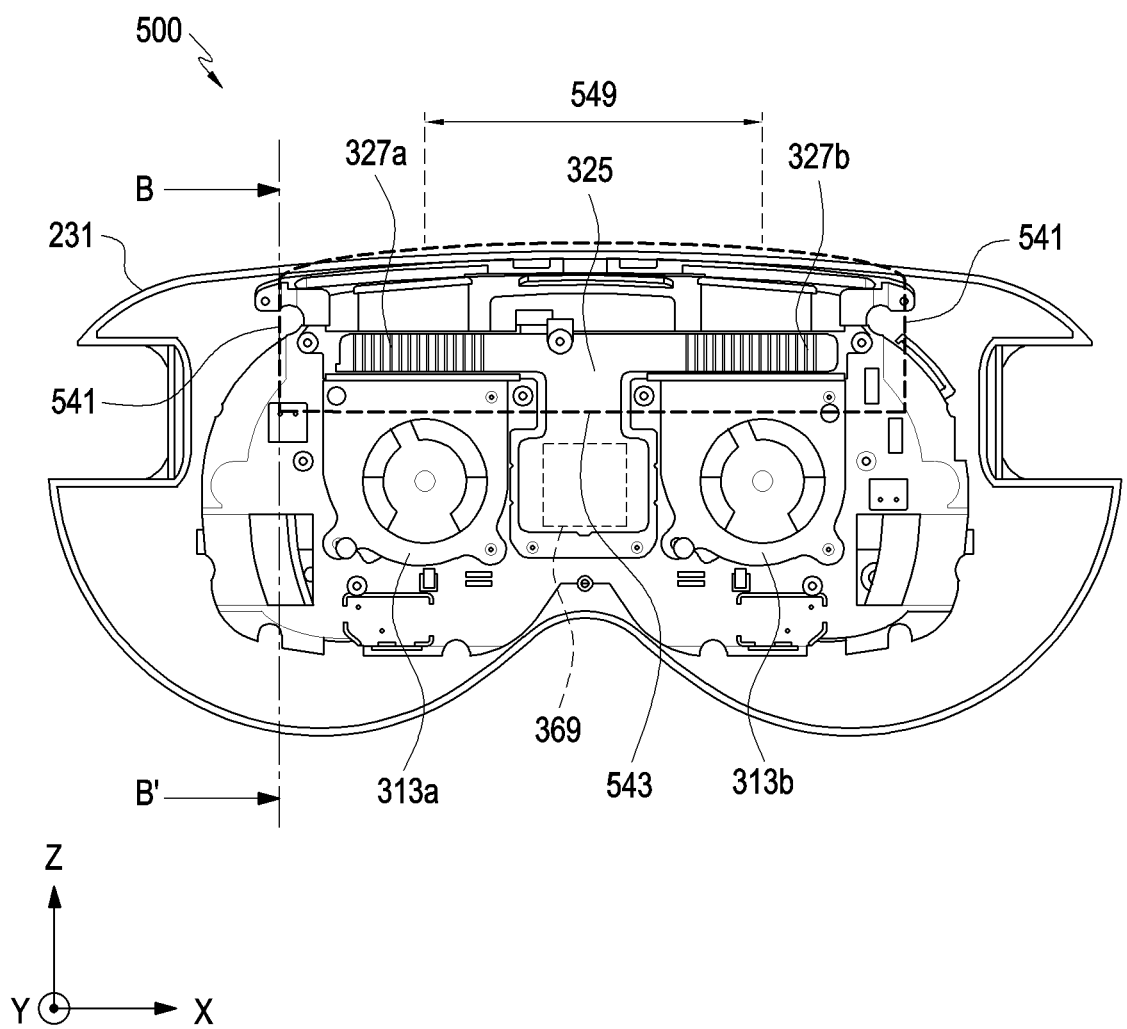
FIG. 11 is a diagram illustrating an example heat dissipation structure of a wearable electronic device according to various embodiments.
Figure 12:
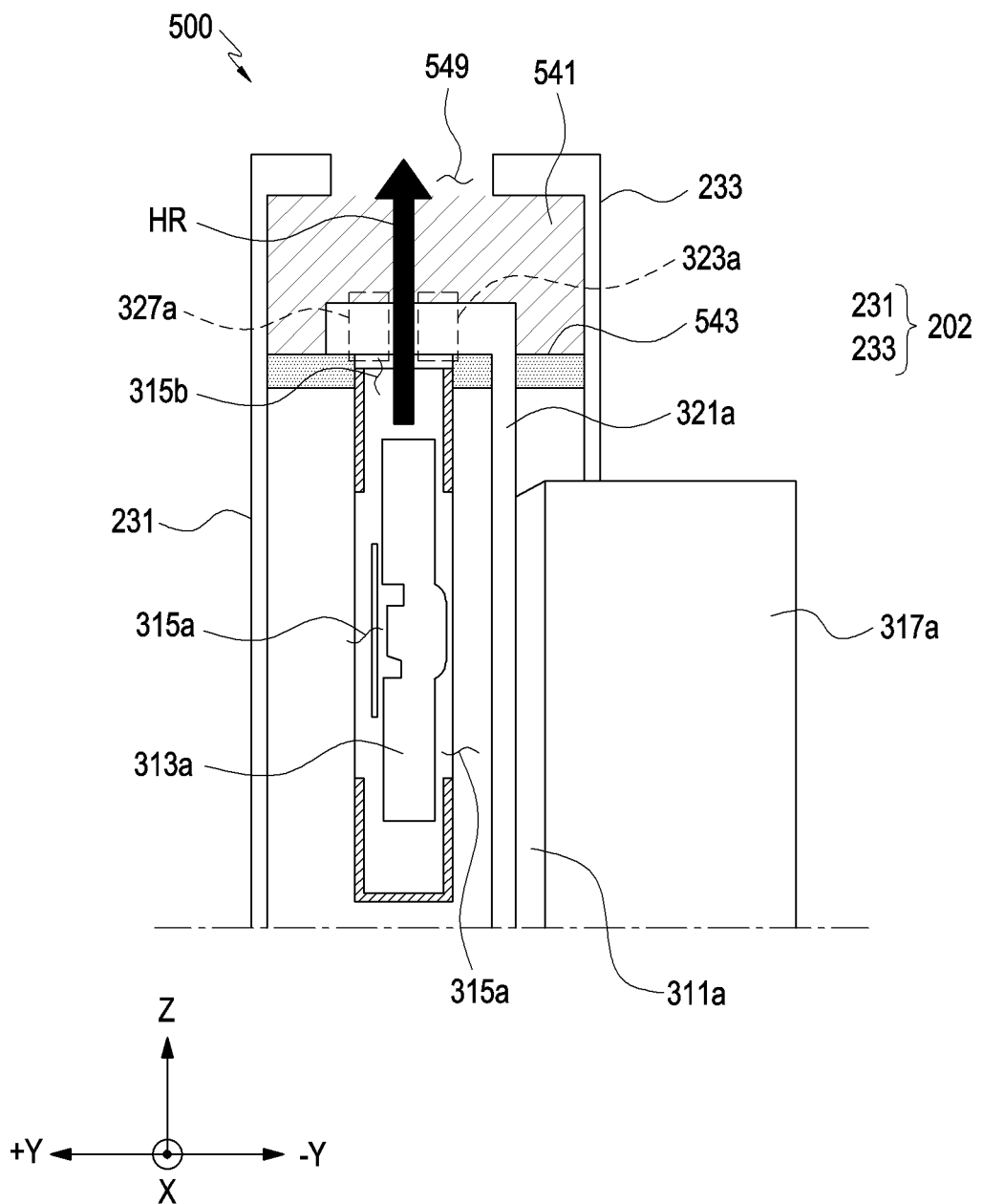
FIG. 12 is a cross-sectional view illustrating the flow of heat or air inside a first housing in the heat dissipation structure of FIG. 11 according to various embodiments.

According to an embodiment, although not illustrated, the wearable electronic device 200 and/or the heat dissipation structure 300 may further include at least one sealing member (e.g., the sealing members 541 and 543 of FIG. 11 or FIG. 12). The sealing member may include, for example, an elastic body with compressibility, such as a sponge or rubber. In an embodiment, the sealing member may be provided in a contact portion (or gap) between the enclosure 304 and the heat dissipation fans 313a and 313b, a contact portion (or gap) between the enclosure 304 and the heat conductive members 321a and 321b, and/or a contact portion (or gap) between the enclosure 304 and the heat dissipation fins 323a and 323b. For example, in the duct structure implemented by the enclosure 304, a sealing member may be provided to further inhibit the heated air from flowing back into another space within the first housing 202 through a gap between the different structures. In an embodiment, when a gap sufficient to enable air flow is formed between the heat dissipation fans 313a and 313b and the heat conductive members 321a and 321b, the gap may be blocked by an additional sealing member. As will be discussed with reference to FIG. 11, the movement path of air discharged from the inside of the first housing 202 may be isolated from other spaces inside the first housing 202 by the sealing member itself. In this case, the enclosure 304 may be omitted, or substantially some of the structures of the inner surface of the first housing 202 and/or at least some of sealing members may implement a duct structure.

According to an embodiment, the first heat dissipation fin 323a (and/or the second heat dissipation fin 323b) may be at least partially disposed on the flow path of the discharged air. For example, the first heat dissipation fin 323a (and/or the second heat dissipation fin 323b) may be disposed at least partially within the space defined by the enclosure 304. Accordingly, the air flowing by the heat dissipation fans 313a and 313b may cool the first heat dissipation fin 323a and/or the second heat dissipation fin 323b, and during the cooling process, the enclosure 304 may suppress the heat discharged from the first housing from flowing back into the inside of the first housing 202.

According to an embodiment, when the wearable electronic device 200 operates, the first heat conductive member 321a and/or the second heat conductive member 321b may have the highest temperature in the portion closest to the displays 311a and 311b, and the temperature may be gradually lowered away from the highest temperature portion. For example, when the displays 311a and 311b generate heat, the first heat conductive member 321a and/or the second heat conductive member 321b may have the lowest temperature in the portion where the heat dissipation fins 323a and 323b are disposed. As a result, the heat generated in the displays 311a and 311b may be moved to the portion where the heat dissipation fins 323a and 323b are disposed via the heat conductive members 321a and 321b, and the heat dissipation fans 313a and 313b may operate to cool the heat dissipation fins 323a and 323b, thereby promoting heat dissipation or heat transfer to the heat dissipation fins 323a and 323b.

According to an embodiment, although not illustrated, the wearable electronic device 200 and/or the first housing 202 may further include a dummy hole(s) provided to extend from the space where the integrated circuit chip 369 and/or displays 311a and 311b are disposed to the outer space. For example, when the first heat dissipation fan 313a and the second heat dissipation fan 313b suction air in the space where the integrated circuit chip 369 and/or the displays 311a and 311b are disposed, the outside air may flow into the inside of the first housing 202. By allowing the outside air to flow into the wearable electronic device 200 and/or the first housing 202 while discharging the heated air inside the wearable electronic device 200 and/or the first housing 202, cooling performance for heat generation components can be improved. These dummy holes may be provided, for example, in the rear case 233, the second housing 203, and/or the lens assemblies 317a and 317b, and at least a portion of the first display 311a and/or the second display 311b may be disposed in the air flow path leading to the heat dissipation fan 313a and/or the second heat dissipation fan 313b from the dummy holes. For example, the first display 311a and/or the second display 311b may be provided with a cooling structure (or a heat dissipation structure 300) by the heat conductive members 321a and 321b, and/or may be cooled by the air flowing into the first and second displays through the dummy holes. The number, sizes, shapes, and/or positions of these dummy holes may be selected appropriately by taking the structural stability of the wearable electronic device 200 (e.g., the first housing 202) or heat dissipation performance to be implemented through the heat dissipation structure 300 into consideration.

According to an embodiment, the wearable electronic device 200 may include an integrated circuit chip 369 disposed on a circuit board 360 (e.g., the circuit board 260 in FIG. 4) as one of the heat generation components. The integrated circuit chip 369 may be disposed in an area (or space) between the first display 311a and the second display 311b. For example, the integrated circuit chip 369 may be disposed between the first display 311a and the second display 311b in the X-axis direction. In FIG. 5, the integrated circuit chip 369 is illustrated as being disposed on the third heat conductive member 325, but this is to illustrate that the heat generated by the integrated circuit chip 369 is absorbed, dissipated, or moved by the third heat conductive member 325. It is noted that the integrated circuit chip 369 is substantially disposed on the circuit board 360. When an integrated circuit chip is placed on the circuit board 360 of FIG. 5, it may be understood that a heat sink is placed on or thermal grease is applied to the portion indicated by "369". The integrated circuit chip 369 may incorporate at least one of, for example, a processor (e.g., the processor 120 in FIG. 1), memory (e.g., the memory 130 in FIG. 1), and a power management module (e.g., the power management module 188 in FIG. 1), or a communication module (e.g., the communication module 190 in FIG. 1), each of which may include various circuitry.

According to an embodiment, the third heat conductive member 325 configured to absorb, dissipate, or move heat from the integrated circuit chip 369 may include a heat pipe, a vapor chamber, and/or a heat conductive plate, which may be similar to the first heat conductive member 321a and/or the second heat conductive member 321b. In the illustrated embodiment, the third heat conductive member 325 has an alphabet "T" shape and may be useful in suppressing the center of gravity of the wearable electronic device 300 from being biased. In an embodiment, the third heat conductive member 325 may absorb heat from a heat generation component (e.g., the integrated circuit chip 369), and dissipate or move the heat to both end portions thereof. One of both end portions of the third heat conductive member 325 (e.g., the portion where the third heat dissipation fin 327a is disposed) may be disposed adjacent to the first heat dissipation fan 313a, and the other of both end portions of the third heat conductive member 325 (e.g., the portion where the fourth heat dissipation fin 327b is disposed) may be disposed adjacent to the second heat dissipation fan 313b.

According to an embodiment, the wearable electronic device 200 and/or the heat dissipation structure 300 may further include the third heat dissipation fin 327a and/or the fourth heat dissipation fin 327b disposed at both end portions of the third heat conductive member 325. In an embodiment, the fourth heat dissipation fin 327a and/or the fourth heat dissipation fin 327b may be disposed on a flow path of air moving by the heat dissipation fans 313a and 313b. For example, the third heat dissipation fin 327a and/or the fourth heat dissipation fin 327b may be at least partially disposed on the discharge ports 315b and 315d of the heat dissipation fans 313a and 313b. In an embodiment, the heat generated in the integrated circuit chip 369 may be dissipated or moved to the third heat dissipation fin 327a and/or the fourth heat dissipation fin 327b, and the air flow generated by the heat dissipation fans 313a and 313b may be discharged to the outside of the first housing 202 while cooling the third heat dissipation fin 327a and/or the fourth heat dissipation fin 327b. As discussed in the foregoing detailed description, that the air moved by the heat dissipation fans 313a and 313b does not flow back into the inner space of the first housing 202 but is discharged to the outside via the inside of the enclosure 304. Here, "the air moved by the heat dissipation fans 313a and 313b" may refer to heat substantially refers to heat generated from heat generation components such as the displays 311a and 311b and/or the integrated circuit chip 369, or air heated by the heat.

According to an embodiment, the third heat dissipation fin 327a and/or the fourth heat dissipation fin 327b may be omitted, and both end portions of the third heat conductive member 325 may be disposed adjacent to the first heat dissipation fin 323a or the second heat dissipation fin 323a. In an embodiment, the third heat dissipation fin 327a and/or the fourth heat dissipation fin 327b may be omitted, and both end portions of the third heat conductive member 325 may be disposed to be substantially in contact with the first heat dissipation fin 323a or the second heat dissipation fin 323a. For example, the first heat dissipation fin 323a may be implemented as a portion of the first heat conductive member 321a to absorb and discharge heat from one end portion of the third heat conductive member 325, and the second heat dissipation fin 323b may be implemented as a portion of the second heat conductive member 321b to absorb and discharge heat from the other end portion of the third heat conductive member 325. For example, the number, sizes, shapes, and/or positions of heat dissipation fins 323a, 323b, 327a, and 327b may be appropriately selected by taking the heat dissipation performance to be implemented through the installation space or the heat dissipation structure provided inside the first housing 202 into consideration.

Figure 8:
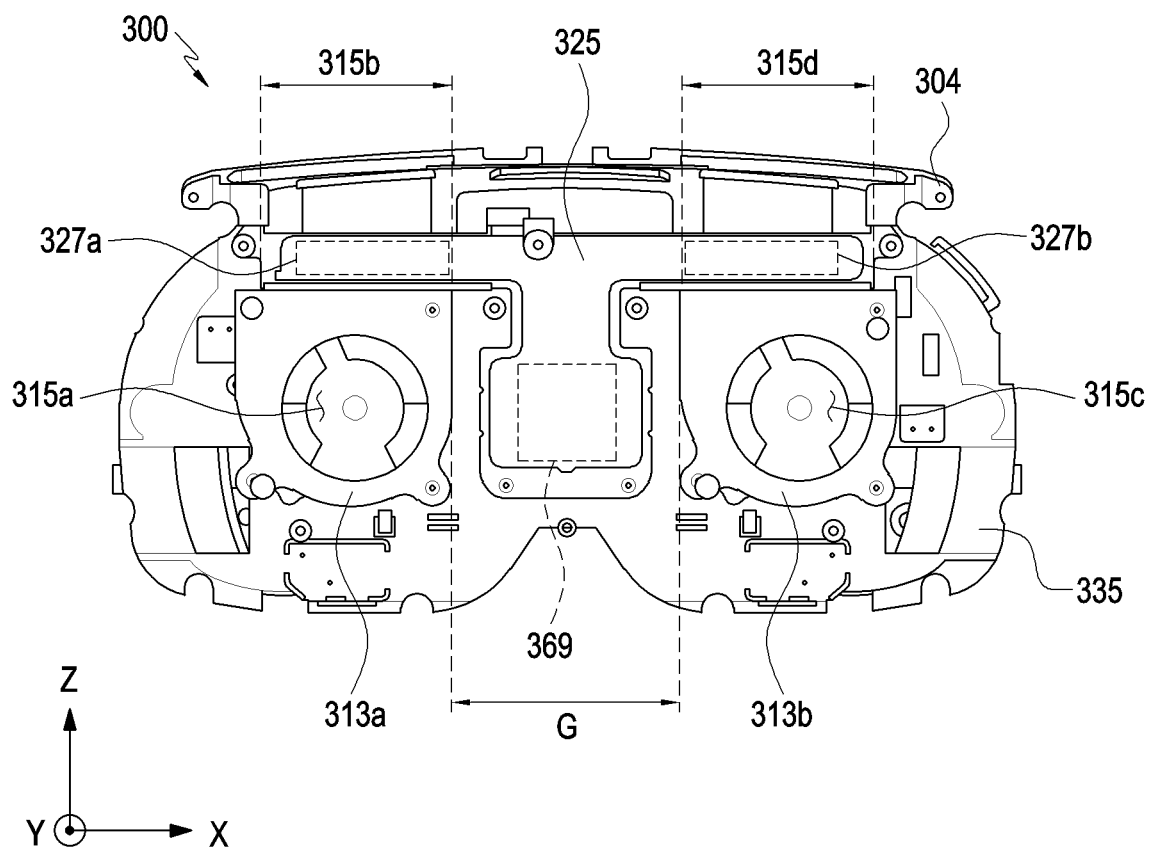
FIG. 8 is diagram illustrating a front view of a heat dissipation structure of a wearable electronic device according to various embodiments.

FIG. 8 is a diagram illustrating a front view of an example heat dissipation structure 300 of a wearable electronic device (e.g., the wearable electronic device 200 in FIG. 4) according to various embodiments.

In the wearable electronic device 200, the gap between displays (e.g., the displays 311a and 311b of FIG. 4) (e.g., the gap G between the heat dissipation fans 313a and 313b) may vary. For example, within the first housing (e.g., the first housing 202 in FIG. 4), the displays 311a and 311b may move toward or away from each other. According to an embodiment, the wearable electronic device 200 may provide an environment in which the user is capable of adjusting the positions of the displays 311a and 311b in accordance with the distance between his/her two eyes. In an embodiment, the heat dissipation fans 313a and 313b may move within the housing 202 together with the displays 311a and 311b, and the gap between the displays 311a and 311b may be proportional to the gap G between the heat dissipation fans 313a and 313b. The embodiment of FIG. 8 illustrates an increased gap between the heat dissipation fans 313a and 313b when compared to the embodiment of FIG. 7. For example, when the user moves the displays 311a and 311b in the X-axis direction (e.g., the +X direction or the −X direction) with reference to the Z-axis, the heat dissipation fans 313a and 313b may move within the first housing 202 or on the display support member 335 together with the corresponding displays 311a and 311b.

According to an embodiment, since the third heat dissipation fin 327a and/or the fourth heat dissipation fin 327b is substantially fixed within the first housing 202, a difference in heat dissipation performance may occur depending on the movement of the heat dissipation fans 313a and 313b. For example, depending on the positions of the heat dissipation fans 313a and 313b, the third heat dissipation fin 327a and/or the fourth heat dissipation fin 327b may partially deviate from an air flow path. In an embodiment, the length (or width) of the discharge ports 315b and 315d in the X-axis direction may be greater than the length (or width) of the third heat dissipation fin 327a and/or the fourth heat dissipation fin 327b. For example, in the range in which the heat dissipation fans 313a and 313b move in the X-axis direction, the third heat dissipation fin 327a and/or the fourth heat dissipation fin 327b may be aligned to substantially overlap the discharge ports 315b and 315d in the Z-axis direction. Here, the "Z-axis direction" may refer to the flow direction of air discharged to the outside by the heat dissipation fans 313a and 313b. In an embodiment, the relative length of the third heat dissipation fin 327a and/or fourth heat dissipation fin 327b with respect to the length (or width) of the discharge ports 315b and 315d may be arbitrarily designed or manufactured. For example, the length of the third heat dissipation fin 327a and/or the fourth heat dissipation fin 327b may be greater than the length of the discharge holes 315b and 315d. In this case, in the entire range in which the heat dissipation fans 313a and 313b move, a portion of the third heat dissipation fin 327a and/or the fourth heat dissipation fin 327b may be aligned to substantially overlap the entire length (or entire width) of one of the discharge portions 315b and 315d. It has been mentioned previously that the heat dissipation fins 327a, and 327b and the discharge ports 315b and 315d substantially overlap in the direction of the flow of air discharged to the outside. The length of the third heat dissipation fin 327a and/or the fourth heat dissipation fin 327b relative to the lengths of the discharge ports 315b and 315d may be appropriately selected by taking the deviation in heat dissipation performance due to the movement of the heat dissipation fans 313a and 313b into consideration. In an embodiment, even if the first heat dissipation fan 313a or the second heat dissipation fan 313b moves, the length or width of the third heat dissipation fin 327a and/or the fourth heat dissipation fin 327b may be kept substantially constant.

Figure 9:
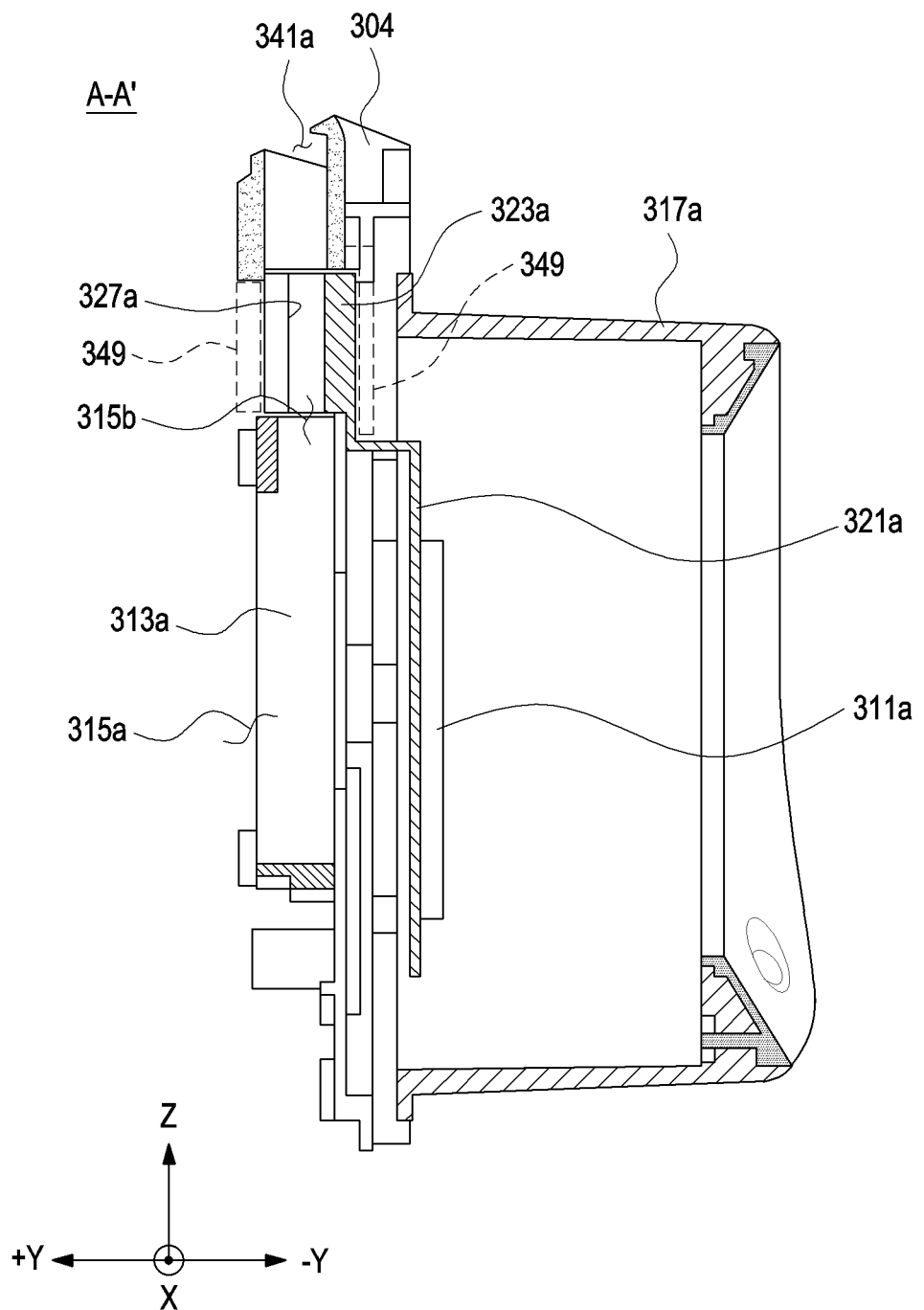
FIG. 9 is a cross-sectional view illustrating the heat dissipation structure of the wearable electronic device taken along line A-A' in FIG. 6 according to various embodiments.

FIG. 9 is a cross-sectional view illustrating the heat dissipation structure 300 of the wearable electronic device (e.g., the wearable electronic device 200 of FIG. 4) taken along line A-A' of FIG. 6 according to various embodiments. FIG. 10 is a cross-sectional view illustrating the flow of heat or air inside the first housing 202 in the heat dissipation structure 300 of FIG. 9 according to various embodiments.

Referring to FIGS. 9 and 10, the first heat dissipation fan 313a may suction at least a portion of the air in the inner space of the first housing 202 and/or the heat generated by the first display 311a (or the heat generated by the integrated circuit chip 369 in FIG. 5) through the suction port 313a and may cause the air and/or the heat to flow into an enclosure (e.g., the enclosure 304 in FIG. 5) through the discharge port 315b. The arrow HR in FIG. 10 illustrates example flow of air flowing into the enclosure 304 and/or air being discharged to the outside via the enclosure 304. Since air flows via the first heat dissipation fin 323a and/or the third heat dissipation fin 327a while being flow into the enclosure 304 by the first heat dissipation fan 313a, the first heat dissipation fin 323a and/or the third heat dissipation fin 327a may be cooled. For example, by operating the first heat dissipation fan 313a (and/or the second heat dissipation fan 313b), movement of the heat generated in the first display 311a (and/or the second display 311b) or the integrated circuit chip 369 to the first heat dissipation fin 323a (and/or the second heat dissipation fin 323b) or the third heat dissipation fin 327a (and/or the fourth heat dissipation fin 327b) via the heat conductive member 321a, 321b, and 325 may be promoted.

In the embodiment illustrated in FIG. 9, the first heat dissipation fin 323a and/or the third heat dissipation fin 327a are illustrated in a structure disposed between the first heat dissipation fan 313a and the enclosure 304. However, an embodiment of the disclosure is not limited to this, and the enclosure 304 may have a more extended or more expanded shape indicated by "349", thereby accommodating at least a portion of the first heat dissipation fin 323a and/or the third heat dissipation fin 327a. In an embodiment, since the first heat dissipation fin 323a and/or the third heat dissipation fin 327a is substantially accommodated in the enclosure 304, heat transferred to the first heat dissipation fin 323a and/or the third heat dissipation fin 327a may be more effectively discharged to the outside of the first housing 202 through an/the air vent (e.g., the air vent 449 in FIG. 10) without flowing back into another space inside the first housing 202. In an embodiment, by placing one or more sealing members when one or more gaps are formed among the first heat dissipation fan 313a, the first heat conductive member 321a, the first heat dissipation fin 323a, and/or the enclosure 304, it is possible to suppress air from flowing back to another area inside the first housing 202 from the space defined by the enclosure 304. In an embodiment, the arrangement of the sealing members and the structure for suppressing backflow of air may be additionally implemented in the gaps between the third heat conductive member 325, the third heat dissipation fin 327a, and/or the enclosure 304.

FIG. 11 is a diagram illustrating a view of an example heat dissipation structure 500 (e.g., the heat dissipation structure 300 in FIG. 5) of a wearable electronic device (e.g., the wearable electronic device 200 in FIG. 4) according to various embodiments. FIG. 12 is a cross-sectional view illustrating flow of heat or air inside the first housing 202 in the heat dissipation structure 500 of FIG. 11 according to various embodiments.

Referring to FIGS. 11 and 12, the above-described enclosure (e.g., the enclosure 304 of FIG. 5) may be omitted, and the wearable electronic device 200 may further include sealing members 541 and 543 disposed to divide the inner space of the first housing 202. In an embodiment, the sealing members 541 and 543 are structures that substantially replace the above-described enclosure 304 and may suppress the air discharged to the outside by the heat dissipation fans 313a and 313b from flowing back to another space inside the first housing 202. It may be easily understood by a person ordinarily skilled in the art that, in suppressing the air to be discharged to the outside from flowing back into another space inside the first housing 202, the above-described enclosure 304 and the sealing members 541 and 543 of FIG. 11 or FIG. 12 may be combined.

According to an embodiment, the sealing members may include a partition protruding from the inner wall surface or inner surface of the first housing (e.g., a front case and/or a rear case), and/or an elastic body attached to the inner wall surface or inner side surface. The term "partition" may refer, for example, to a structure made integrally with the first housing 202 or arranged by assembly, and may have substantially the same material as the first housing 202. In an embodiment, the term "elastic body" refers to a structure made of a low-density elastomer, such as sponge, or a structure made of a material with a higher elastic modulus than the low-density elastomer, such as rubber, and may be made of a material similar to or different from the first housing 202.

According to an embodiment, when the sealing members 541 and 543 may not include an elastic body and may be implemented as partitions, the sealing members 541 and 543 may function as a structure for guiding the flow direction of air discharged to the outer space. For example, when the heat dissipation fans 313a and 313b operate, the sealing members 541 and 543 may be configured to guide the air inside the first housing 202 to the air vent 549 (e.g., the air vent 249 in FIG. 2). In an embodiment, when the sealing members 541 and 543 are implemented as elastic bodies without including the partitions, the sealing members 541 and 543 may isolate the flow path of air to be substantially discharged to the outside by the heat dissipation fans 313a and 313b from another space inside the first housing 202. For example, when the sealing members 541 and 543 are implemented as elastic bodies without including partitions, the area or space configured as a flow path may be substantially sealed with respect to another space inside the first housing 202. In an embodiment, the sealing members 541 and 543 may refer to structures in each of which a partition and an elastic body are combined with each other. For example, as mentioned in the above-described embodiments, the sealing members 541 and 543 are each implemented by disposing an elastic body on a partition, and the sealing members 541 and 543 (e.g., the elastic bodies) are being in close contact with the heat dissipation fans 313a and 313b and/or heat conductive members 321a, 321b, and 325, it is possible to suppress backflow of air to be discharged to the outside.

According to an embodiment, the sealing members 541 and 543 may include first sealing members 541 extending from the inner wall of the first housing 202 (e.g., the front case 231 and/or the rear case 233) in parallel to each other along the Z-axis direction, and a second sealing member 543 extending along the X-axis direction and connecting the first sealing members 541. The air vent 549 (e.g., the air vent 249 in FIG. 2) may be provided through the inner wall of the front case 231 (and/or the rear case 233), and may be substantially disposed in an area between the first sealing members 541. The air to be discharged to the outside by the heat dissipation fans 313a and 313b may be discharged to the outside of the first housing 202 substantially via a space defined by the sealing members 541 and 543, a portion of the inner wall of the front case 231 (and/or the inner wall of the rear case 233), and/or a portion of the inner surface of the front case 231 (and/or the inner surface of the rear case 233), and through the air vent 549. Here, the "portion of the inner wall of the front case 231 (and/or the rear case 233)" may refer to the area where the air vent 549 is located, and may refer to the portion of the inner wall of the front case 231 (and/or the rear case 233) between the first sealing members 541 when referring to FIG. 11. In an embodiment, the "portion of the inner surface of the front case 231" may refer to the area where the air vent 549 is located in the inner wall of the front case 231, and may refer to the area surrounded by the first sealing members 541 and/or the second sealing member 543 when referring to FIG. 11.

According to an embodiment, sealing members substantially the same as the sealing members 541 and 543 provided in the front case 231 may be provided in the rear case 233 of the first housing 202. For example, the air to be discharged to the outside by the heat dissipation fans 313a and 313b may be discharged to the outside of the first housing 202 substantially via a space defined by the sealing members 541 and 543, a portion of the inner wall of the front case 231, a portion of the inner surface of the front case 231, a portion of the inner wall of the rear case 233, and a portion of the inner surface of the rear case 233, and through the air vent 549.

Figure 13:
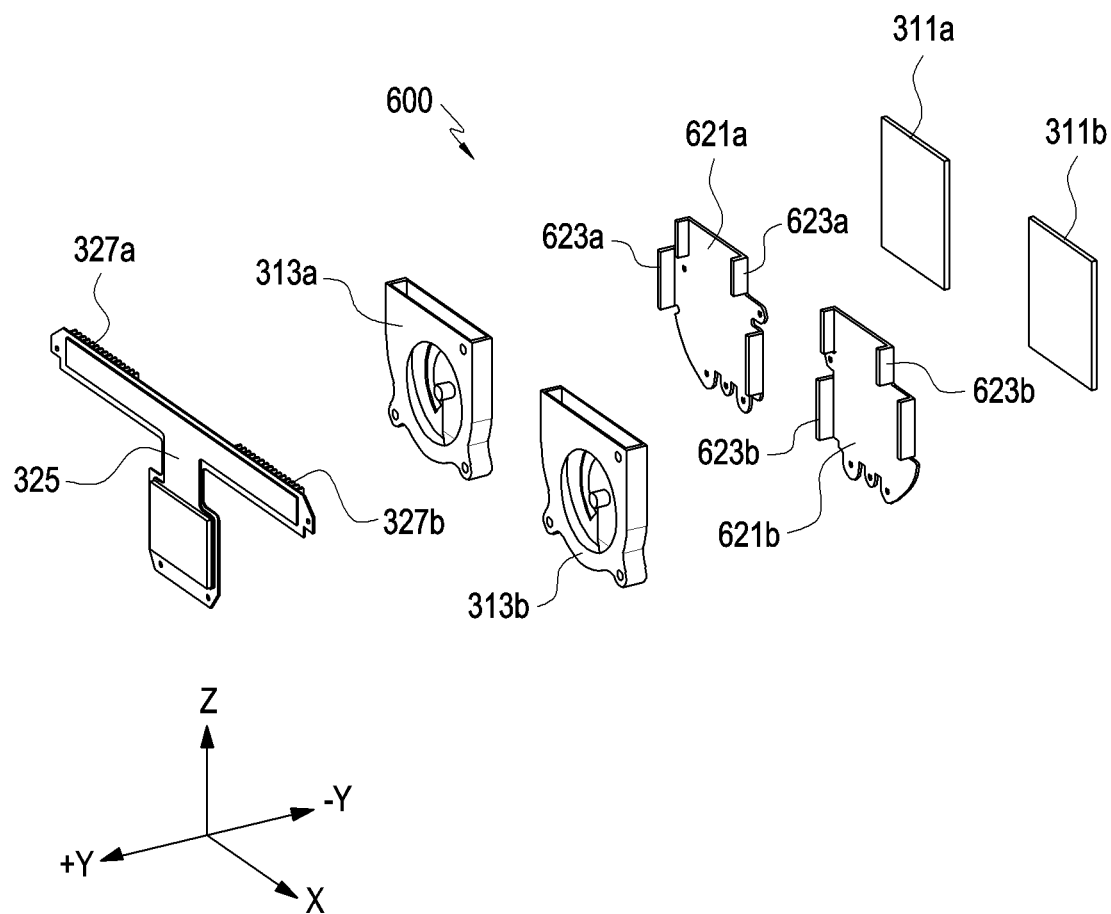
FIG. 13 is an exploded perspective view illustrating an example heat dissipation structure of a wearable electronic device according to various embodiments.
Figure 14:
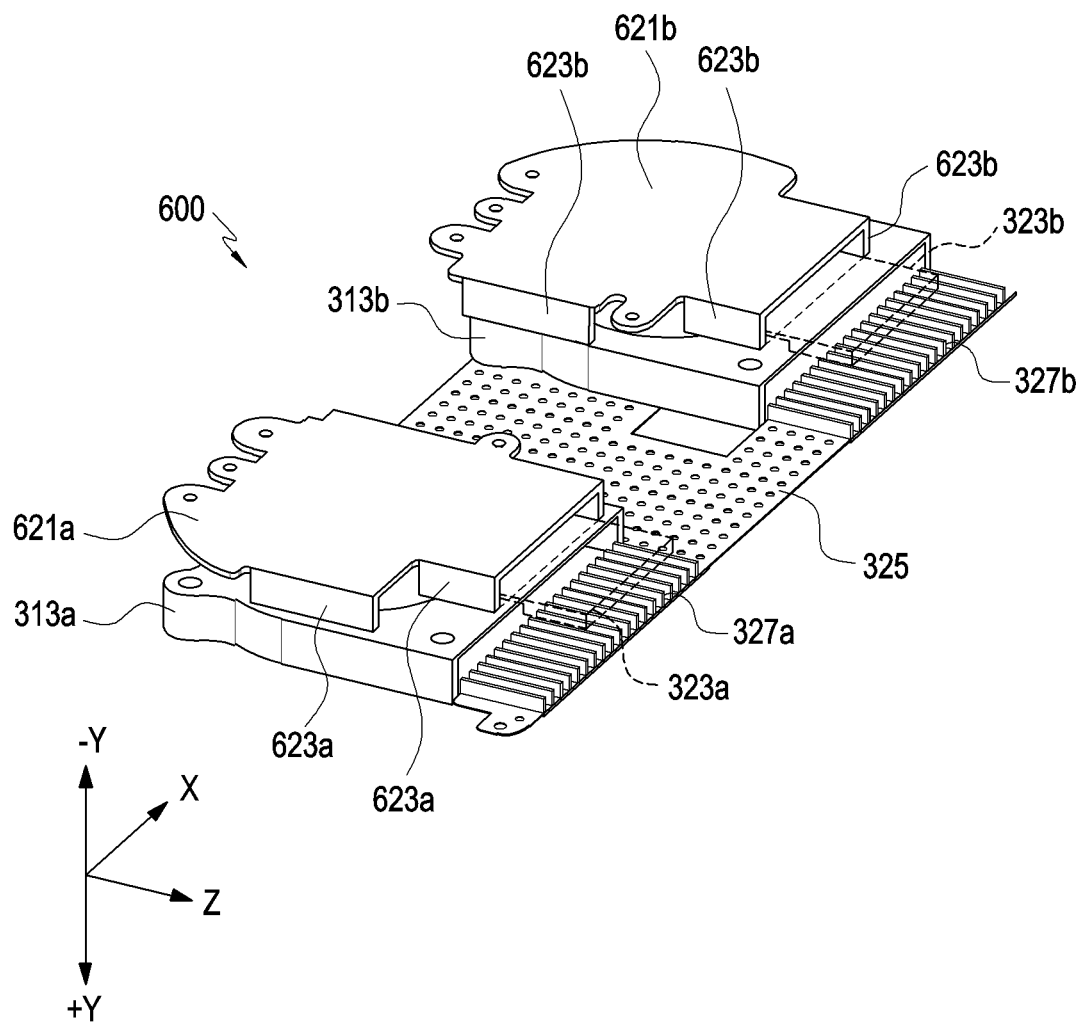
FIG. 14 is a perspective view illustrating the heat dissipation structure of FIG. 13 according to various embodiments.

FIG. 13 is an exploded perspective view illustrating an example heat dissipation structure 600 of a wearable electronic device (e.g., the wearable electronic device 200 in FIG. 4) according to various embodiments. FIG. 14 is a perspective view illustrating the heat dissipation structure 600 of FIG. 13 according to various embodiments.

The heat dissipation structure 600 of FIGS. 13 and/or FIG. 14 may be different from the heat dissipation structure 300 of FIG. 5 (e.g., the first heat conductive member 321a, the second heat conductive member 321b, the first heat dissipation fin 323a, and/or the second heat dissipation fin 323b) in terms of the first heat conductive member 621a, the second heat conductive member 621b, the first heat dissipation fin 623a, and/or the second heat dissipation fin 623b. In describing the heat dissipation structure 600 of FIGS. 13 and/or FIG. 14, for components that can be easily understood from the heat dissipation structure 300 of FIG. 5, the same reference numbers in the drawings may be assigned or omitted, and detailed descriptions may also be omitted. The heat dissipation fins indicated by "323a" and/or "323b" in FIG. 14 are substantially examples of the heat dissipation structure 300 of FIG. 5, and in an embodiment, the heat dissipation fins 323a and 323b of FIG. 5 and the heat dissipation fins 623a and 623b of FIG. 14 may be disposed together on at least one of the heat conductive members 321a, 321b, 621a, and 621b.

Referring to FIGS. 13 and 14, the heat dissipation structure 600 may include heat dissipation fins 623a and 623b extending from at least one edge of the heat conductive members 621a and 621b. In an embodiment, the heat dissipation fins 623a and 623b may be substantially implemented by at least partially bending the edges of the heat conductive members 621a and 621b. For example, the heat dissipation fins 623a and 623b may be substantially portions of the heat conductive members 621a and 621b. In an embodiment, the heat dissipation fins 623a and 623b may be arranged along the edges of the heat conductive members 621a and 621b, and the number of arrangement intervals of heat dissipation fins 623a and 623b may be determined by taking the air flow around the heat conductive members 621a and 621b or the heat dissipation fins 623a and 623b into consideration.

According to an embodiment, the heat dissipation fins 623a and 623b may be understood as being disposed between one of the heat conductive members 621a and 621b and the corresponding heat dissipation fans 313a and 313b. For example, when the heat dissipation fans 313a, 313b include suction ports (e.g., the suction ports 315a and 315c in FIG. 5) in the −Y direction, air flowing into the heat dissipation fans 313a and 313b may cool the heat dissipation fins 623a and 623b and/or the heat conductive members 621a and 621b while flowing around the heat dissipation fins 623a and 623b. In an embodiment, the heat dissipation fins 623a and 623b may be disposed so that the heat conductive members 621a and 621b can have a greater surface area that can be in contact with the surrounding air. For example, the heat dissipation fins 623a and 623b may be disposed so that heat absorbed from the displays 311a and 311b can be more quickly moved, dissipated, or discharged by the heat conductive members 621a and 621b.

According to an embodiment, as mentioned above, the heat dissipation structure 600 of FIG. 13 and/or FIG. 14 may further include the heat dissipation fins 323a and 323b of FIG. 5. Accordingly, the air flowing into the heat dissipation fans 313a and 313b may cool the heat dissipation fins 623a and 623b and/or the heat conductive members 621a and 621b, and the air discharged by the heat dissipation fans 313a and 313b may discharge heat from the heat dissipation fins 323a and 323b to the outside of the wearable electronic device (e.g., the wearable electronic device 200 of FIG. 4).

As described above, even if a wearable electronic device (e.g., the electronic device 101 of FIG. 1 and/or the wearable electronic device 200 of FIGS. 2 to 4) according to various embodiments of the disclosure includes a plurality of high-resolution displays (e.g., the displays 241, 242, 311a, and 311b in FIG. 4 or FIG. 5), heat generated from a processor (e.g., the processor 120 of FIG. 1 and/or the integrated circuit chip 369 in FIG. 5) or the displays can be quickly discharged. For example, the wearable electronic device may provide a stable operating environment for various electronic components. In an embodiment, since the heat generated during the use of the wearable electronic device can be quickly discharged, even if the wearable electronic device is in direct contact with the user's body (e.g., face), discomfort felt by the user or injury (e.g., low-temperature burns) can be prevented and/or reduced. In an embodiment, since a plurality of heat dissipation fans (e.g., the heat dissipation fans 313a and 313b in FIG. 5) or heat conductive members (e.g., the heat conductive members 321a, 321b, and 325 in FIG. 5) provided as a heat dissipation structure are arranged substantially symmetrically within the wearable electronic device, it is possible to suppress the center of gravity of the wearable electronic device from being biased. For example, when worn, the wearable electronic device can provide a balanced sense of weight or stability to the user.

The effects that are capable of being obtained by the disclosure are not limited to those described above, and other effects not described above may be clearly understood by a person ordinarily skilled in the art to which the disclosure belongs from the descriptions of the above-described example embodiments.

As described above, a wearable electronic device (e.g., the electronic device 101 in FIG. 1 and/or the wearable electronic device 200 in FIGS. 2 to 4) according to an example embodiment of the disclosure may include: a housing (e.g., the housing 210 or the first housing 202 in FIG. 4) disposed and configured to face a user's face, a first display (e.g., one of the displays 241, 242, 311a, and 311b in FIG. 4 or FIG. 5) disposed inside the housing and configured to provide visual information to one of the user's eyes, a first heat dissipation fan (e.g., the first heat dissipation fan 313a in FIG. 5) disposed to at least partially face the first display and configured to discharge air inside the housing to the outside of the housing, a first heat conductive member comprising a thermally conductive material (e.g., the first heat conductive member 321a in FIG. 5) configured to absorb, dissipate, and/or move heat from the first display, a first heat dissipation fin (e.g., the first heat dissipation fin 323a in FIG. 5) provided at one end portion of the first heat conductive member and disposed on a movement path of air discharged by the first heat dissipation fan, a second display (e.g., another one of the displays 241, 242, 311a, and 311b in FIG. 4 or FIG. 5) configured to provide visual information to the other another of the user's eyes, a second heat dissipation fan (e.g., the second heat dissipation fan 313b in FIG. 5) disposed to at least partially face the second display and configured to discharge air inside the housing to the outside of the housing, a second heat conductive member (e.g., the second heat conductive member 321b in FIG. 5) configured to absorb, dissipate, and/or move heat from the second display, and a second heat dissipation fin (e.g., the second heat dissipation fin 323b in FIG. 5) provided at one end portion of the second heat conductive member and disposed on a movement path of the air discharged by the second heat dissipation fan.

According to an example embodiment, the first heat conductive member and/or the second heat conductive member may include at least one of a heat pipe, a vapor chamber, or a heat conductive plate.

According to an example embodiment, the wearable electronic device may further include: an integrated circuit chip (e.g., the integrated circuit chip 369 in FIG. 5) disposed in an area or space between the first display and the second display, and a third heat conductive member comprising a thermally conductive material (e.g., the third heat conductive member 325 in FIG. 5) configured to absorb, dissipate, and/or move heat from the integrated circuit chip. In an example embodiment, one of both end portions of the third heat conductive member may be disposed adjacent to the first heat dissipation fin. In an example embodiment, the another of both end portions of the third heat conductive member may be disposed adjacent to the second heat dissipation fin.

According to an example embodiment, the wearable electronic device may further include: an integrated circuit chip disposed in the area or space between the first display and the second display, a third heat conductive member comprising a thermally conductive material configured to absorb, dissipate, and/or move heat from the integrated circuit chip, a third heat dissipation fin (e.g., the third heat dissipation fin 327a in FIG. 5) provided at one of both end portions of the third heat conductive member and disposed on the movement path of air discharged by the first heat dissipation fan, and a fourth heat dissipation fin (e.g., the fourth heat dissipation fin 327b in FIG. 5) provided at another one of both end portions of the third heat conductive member and disposed on the movement path of the air discharged by the second heat dissipation fan.

According to an example embodiment, the third heat conductive member may include at least one of a heat pipe, a vapor chamber, or a heat conductive plate.

According to an example embodiment, the wearable electronic device may further include: at least one air vent (e.g., the air vent 249 or 549 in FIG. 2 or FIG. 11) formed in the housing. In an example embodiment, the first heat dissipation fan or the second heat dissipation fan may be configured to discharge the air inside the housing to the outside of the housing through the at least one air vent.

According to an example embodiment, the first heat dissipation fin may be disposed between the first heat dissipation fan and the at least one air vent, and/or the second heat dissipation fin may be disposed between the second heat dissipation fan and the at least one air vent.

According to an example embodiment, the wearable electronic device may further include at least one enclosure (e.g., the enclosure 304 in FIG. 5) provided inside the housing. In an example embodiment, the enclosure may be configured to guide air, discharged from the inside of the housing to the outside by the first heat dissipation fan or the second heat dissipation fan, to the at least one air vent defining at least a portion of a space connected to the at least one air vent.

According to an example embodiment, the first heat dissipation fin or the second heat dissipation fin may be at least partially disposed in the space defined by the enclosure.

According to an example embodiment, the first heat dissipation fan or the second heat dissipation fan may be configured to suction the air inside the housing and to supply the suctioned air to the space defined by the enclosure via the first heat dissipation fin or the second heat dissipation fin.

According to an example embodiment, the wearable electronic device may further include at least one seal (e.g., the sealing members 541 and 543 of FIG. 11 or FIG. 12) configured to prevent and/or reduce air, introduced into the enclosure by the first heat dissipation fan or the second heat dissipation fan, from flowing back into another space inside the housing. In an example embodiment, the at least one seal may be disposed in at least one of the gap between the first heat dissipation fan and the inner surface of the housing, the gap between the first heat dissipation fan and the enclosure, the gap between the first heat dissipation fan and the first heat conductive member, the gap between the second heat dissipation fan and the inner surface of the housing, the gap between the second heat dissipation fan and the enclosure, and/or the gap between the second heat dissipating fan and the second heat conductive member.

According to an example embodiment, the first display and the second display may be configured to move toward or away from each other.

According to an example embodiment, the first heat dissipation fan may be configured to move together with the first display, and the second heat dissipation fan may be configured to move together with the second display.

According to an example embodiment of the disclosure, a wearable electronic device (e.g., the electronic device 101 in FIG. 1 and/or the wearable electronic device 200 in FIGS. 2 to 4) may include: a housing (e.g., the housing 210 or the first housing 202 in FIG. 4) disposed and configured to face a user's face, a first display (e.g., one of the displays 241, 242, 311a, and 311b in FIG. 4 or FIG. 5) disposed inside the housing and configured to provide visual information to one of the user's eyes, a first heat dissipation fan (e.g., the first heat dissipation fan 313a in FIG. 5) disposed to at least partially face the first display and configured to discharge the air inside the housing to the outside of the housing, a first heat conductive member comprising a thermally conductive material (e.g., the first heat conductive member 321a in FIG. 5) configured to absorb, dissipate, and/or move heat from the first display, a first heat dissipation fin (e.g., the first heat dissipation fin 323a in FIG. 5) provided at one end portion of the first heat conductive member and at least partially disposed on a movement path of the air discharged by the first heat dissipation fan, a second display (e.g., another one of the displays 241, 242, 311a, and 311b in FIG. 4 or FIG. 5) configured to provide visual information to another of the user's eyes, a second heat dissipation fan (e.g., the second heat dissipation fan 313b in FIG. 5) disposed to at least partially face the second display and configured to discharge the air inside the housing to the outside of the housing, a second heat conductive member comprising a thermally conductive material (e.g., the second heat conductive member 321b in FIG. 5) configured to absorb, dissipate, and/or move heat from the second display, a second heat dissipation fin (e.g., the second heat dissipation fin 323b in FIG. 5) provided at one end of the second heat conductive member and at least partially disposed on a movement path of the air discharged by the second heat dissipation fan, an integrated circuit chip (e.g., the integrated circuit chip 369 in FIG. 5) disposed in an area or space between the first display and the second display, a third heat conductive member comprising a thermally conductive material (e.g., the third heat conductive member 325 in FIG. 5) configured to absorb, dissipate, and/or move heat from the integrated circuit chip, a third heat dissipation fin (e.g., the third heat dissipation fin 327a in FIG. 5) provided at one of both end portions of the third heat conductive member and at least partially disposed on the movement path of the air discharged by the first heat dissipation fan, and a fourth heat dissipation fin (e.g., the fourth heat dissipation fin 327b in FIG. 5) provided at one end of the second heat conductive member and at least partially disposed on the movement path of the air discharged by the second heat dissipation fan. In an example embodiment, the first display and the second display may be configured to move toward or away from each other.

According to an example embodiment, the first heat dissipation fan may be configured to move together with the first display, and the second heat dissipation fan may be configured to move together with the second display.

According to an example embodiment, the first heat dissipation fan and/or the second heat dissipation fan may include a suction port (e.g., the suction ports 315a and 315c in FIG. 5) configured to suction the air inside the housing, and a discharge port (e.g., the discharge ports 315b and 315d in FIG. 5) configured to discharge the suctioned air. In an example embodiment, the first heat dissipation fin, the second heat dissipation fin, the third heat dissipation fin, and the fourth heat dissipation fin may be disposed on the discharge port and overlap each other.

According to an example embodiment, the first heat dissipation fan may be configured to move together with the first display, and the second heat dissipation fan may be configured to move together with the second display. In an example embodiment, even if the first heat dissipation fan or the second heat dissipation fan moves, the length or width of the third heat dissipation fin and the fourth heat dissipation fin overlapping the discharge port may be maintained.

According to an example embodiment, the first heat conductive member, the second heat conductive member, or the third heat conductive member may include at least one of a heat pipe, a vapor chamber, or a heat conductive plate.

According to an example embodiment, the wearable electronic device may further include at least one air vent (e.g., the air vent 249 or 549 in FIG. 2 or FIG. 11) provided in the housing. In an example embodiment, the first heat dissipation fan or the second heat dissipation fan may be configured to discharge the air inside the housing to the outside of the housing through the at least one air vent.

According to an example embodiment, the wearable electronic device may further include: at least one enclosure (e.g., the enclosure 304 in FIG. 5) provided inside the housing, wherein the enclosure is configured to guide air, discharged from the inside of the housing to the outside by the heat dissipation fan and/or the second heat dissipation fan, to the at least one air vent defining at least a portion of the space connected to the air vent. In an example embodiment, the heat dissipation fan and/or the second heat dissipation fan may include a suction port (e.g., the suction ports 315a and 315c in FIG. 5) configured to suck air from another space inside the housing, and a discharge port (e.g., the discharge ports 315b and 315d in FIG. 5) configured to allow the suctioned air to flow into the space defined by the enclosure.

According to an example embodiment of the disclosure, a wearable electronic device (e.g., the electronic device 101 in FIG. 1 and/or the wearable electronic device 200 in FIGS. 2 to 4) includes: a housing (e.g., the housing 210 or the first housing 202 in FIG. 4) disposed and configured to face a user's face, a first display (e.g., one of the displays 241, 242, 311a, and 311b in FIG. 4 or FIG. 5) disposed inside the housing and configured to provide visual information to one of the user's eyes, a first heat dissipation fan (e.g., the first heat dissipation fan 313a in FIG. 5 or FIG. 13) disposed to at least partially face the first display and configured to discharge the air inside the housing to the outside of the housing, a first heat conductive member comprising a thermally conductive material (e.g., the first heat conductive member 621a in FIG. 13 or FIG. 14) configured to absorb, dissipate, and/or move heat from the first display, at least one first heat dissipation fin (e.g., the first heat dissipation fin 623a of FIG. 13 or FIG. 14) provided at an edge of the first heat conductive member, a second display (e.g., another one of the displays 241, 242, 311a, and 311b in FIG. 4 or FIG. 5) configured to provide visual information to another of the user's eyes, a second heat dissipation fan (e.g., the second heat dissipation fan 313b in FIG. 5 or FIG. 13) disposed to at least partially face the second display and configured to discharge the air inside the housing to the outside of the housing, a second heat conductive member comprising a thermally conductive material (e.g., the second heat conductive member 621b in FIG. 13 or FIG. 14) configured to absorb, dissipate, and/or move heat from the second display, at least one second heat dissipation fin (e.g., the second heat dissipation fin 623b of FIG. 13 or FIG. 14) provided at an edge of the second heat conductive member, an integrated circuit chip (e.g., the integrated circuit chip 369 in FIG. 5) disposed in an area or space between the first display and the second display, a third heat conductive member comprising a thermally conductive material (e.g., the third heat conductive member 325 in FIG. 5 or FIG. 13) configured to absorb, dissipate, and/or move heat from the integrated circuit chip, a third heat dissipation fin (e.g., the third heat dissipation fin 327a in FIG. 5 or FIG. 13) provided at one of both end portions of the third heat conductive member and at least partially disposed on the movement path of the air discharged by the first heat dissipation fan, and a fourth heat dissipation fin (e.g., the fourth heat dissipation fin 327b in FIG. 5 or FIG. 13) provided at one end of the second heat conductive member and at least partially disposed on the movement path of the air discharged by the second heat dissipation fan. In an example embodiment, the first heat dissipation fin is disposed in the space between the first heat conductive member and the first heat dissipation fan, and the second heat dissipation fin is disposed in the space between the second heat conductive member and the second heat dissipation fan.

According to an example embodiment, the first display and the second display may be configured to move toward or away from each other. In an example embodiment, the first heat dissipation fan may be configured to move together with the first display, and the second heat dissipation fan may be configured to move together with the second display.

According to an example embodiment, the first heat dissipation fan and/or the second heat dissipation fan may include a suction port (e.g., the suction ports 315a and 315c in FIG. 5) configured to suction the air inside the housing, and a discharge port (e.g., the discharge ports 315b and 315d in FIG. 5) configured to discharge the suctioned air. In an example embodiment, the third heat dissipation fin and the fourth heat dissipation fin may be disposed on the discharge port and overlap each other.

According to an example embodiment, the first display and the second display may be configured to move toward or away from each other. In an example embodiment, the first heat dissipation fan may be configured to move together with the first display, and the second heat dissipation fan may be configured to move together with the second display.

In an example embodiment, even if the first heat dissipation fan or the second heat dissipation fan moves, the length or width of the third heat dissipation fin and the fourth heat dissipation fin overlapping the discharge port may be maintained.

According to an example embodiment, the first heat conductive member, the second heat conductive member, and/or the third heat conductive member may include at least one of a heat pipe, a vapor chamber, or a heat conductive plate.

According to an example embodiment, the wearable electronic device may further include: at least one air vent (e.g., the air vent 249 or 549 in FIG. 2 or FIG. 11) provided in the housing. In an example embodiment, the first heat dissipation fan and/or the second heat dissipation fan may be configured to discharge the air inside the housing to the outside of the housing through the at least one air vent.

According to an example embodiment, the wearable electronic device may further include: at least one enclosure (e.g., the enclosure 304 in FIG. 5) provided inside the housing, wherein the enclosure is configured to guide the air discharged from the inside of the housing to the outside by the heat dissipation fan or the second heat dissipation fan, to the at least one air vent defining at least a portion of the space connected to the air vent. In an example embodiment, the first heat dissipation fan or the second heat dissipation fan may include a suction port (e.g., the suction ports 315a and 315c in FIG. 5) configured to suction air from another space inside the housing, and a discharge port (e.g., the discharge ports 315b and 315d in FIG. 5) that allows the suctioned air to flow into the space defined by the enclosure.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:
1. A wearable electronic device comprising:
a housing disposed and configured to face a user's face when a user wears the wearable electronic device;
a first display disposed at least partially in the housing and configured to provide visual information to an eye of the user;
a first heat conductive member, comprising thermally conductive material, disposed and configured to face the user's face with at least the first display interposed therebetween when a user wears the wearable electronic device, wherein the first heat conductive member includes a first portion substantially parallel to the first display and a second portion bent from the first portion;
an integrated circuit chip disposed in the housing;
a third heat conductive member, comprising thermally conductive material, disposed between at least the integrated circuit chip and the first display;
a first heat dissipation fan disposed between at least the first heat conductive member and the third heat conductive member; and
a first heat dissipation fin, which may be part of one of the heat conductive members, disposed in a movement path of the air to be discharged by the first heat dissipation fan to an outside of the wearable electronic device, wherein the wearable electronic device is configured so that heat generated from the first display is to be transferred to the outside of the wearable electronic device through a path including the first heat conductive member, the first heat dissipation fan, and the first heat dissipation fin, and wherein the wearable electronic device is configured so that heat generated from the integrated circuit chip is to be transferred to the outside of the wearable electronic device via at least the first heat dissipation fan through a path including the third heat conductive member and the first heat dissipation fin.

2. The wearable electronic device of claim 1, wherein the first portion of the first heat conductive member is spaced apart from the first heat dissipation fan, and the third heat conductive member is disposed adjacent to the first heat dissipation fan.

3. The wearable electronic device of claim 1, wherein the first heat conductive member and/or the third heat conductive member comprises at least one of a heat pipe, a vapor chamber, or a heat conductive plate.

4. The wearable electronic device of claim 1, further comprising at least one air vent formed in the housing, wherein the wearable electronic device is configured so that the heat generated from the first display is to be transferred to the outside of the wearable electronic device through a path including the first heat conductive member, the first heat dissipation fan, the first heat dissipation fin, and the at least one air vent, and wherein the wearable electronic device is configured so that the heat generated from the integrated circuit chip is to be transferred to the outside of the wearable electronic device via the first heat dissipation fan through a path including the third heat conductive member, the first heat dissipation fin, and the at least one air vent.

5. The wearable electronic device of claim 1, further comprising:

a second display configured to provide visual information to a another one of the user's eyes, and wherein the first display and the second display are configured to move toward and/or away from each other.

6. The wearable electronic device of claim 5, further comprising:

a second heat dissipation fan disposed to at least partially face the second display and configured to discharge air inside the housing to the outside of the housing;

a second heat conductive member, comprising thermally conductive material, configured to absorb, dissipate, and/or move heat from the second display; and a second heat dissipation fin provided at an end and/or side portion of the second heat conductive member and disposed on a movement path of the air to be discharged by the second heat dissipation fan.

7. The wearable electronic device of claim 6, wherein the second heat conductive member comprises at least one of a heat pipe, a vapor chamber, or a heat conductive plate.

8. The wearable electronic device of claim 6, wherein the wearable electronic device is configured so that heat generated from the second display is to be transferred to the outside of the wearable electronic device through a path including the second heat conductive member, the second heat dissipation fan, and the second heat dissipation fin.

9. The wearable electronic device of claim 6, wherein the first heat dissipation fan is configured to move together with the first display, and the second heat dissipation fan is configured to move together with the second display.

10. The wearable electronic device of claim 6, further comprising at least one enclosure provided inside the housing, wherein the enclosure is configured to guide air discharged from inside the housing to the outside by the first heat dissipation fan and/or the second heat dissipation fan, to at least one air vent formed in the housing.

11. The wearable electronic device of claim 10, wherein the first heat dissipation fin and/or the second heat dissipation fin is at least partially disposed in the space defined by the enclosure.

12. The wearable electronic device of claim 10, wherein the first heat dissipation fan and/or the second heat dissipation fan is configured to:

suction air inside the housing; and allow the suctioned air to flow into space defined by the enclosure via the first heat dissipation fin and/or the second heat dissipation fin.

13. The wearable electronic device of claim 10, further comprising: at least one seal configured to prevent and/or reduce air flowing into a space of the enclosure by the first heat dissipation fan and/or the second heat dissipation fan from flowing back into another space inside the housing, wherein the at least one seal is disposed in at least one of: a gap between the first heat dissipation fan and the inner surface of the housing, a gap between the first heat dissipation fan and the enclosure, a gap between the first heat dissipation fan and the first heat conductive member, a gap between the second heat dissipation fan and the inner surface of the housing, a gap between the second heat dissipation fan and the enclosure, or a gap between the second heat dissipating fan and the second heat conductive member.

14. The wearable electronic device of claim 6, wherein the first heat dissipation fan and/or the second heat dissipation fan comprises:

a suction port configured to suction the air inside the housing; and a discharge port configured to discharge the suctioned air.

* * * * *